(12) United States Patent
Kitagawa

(10) Patent No.: US 8,415,711 B2
(45) Date of Patent: Apr. 9, 2013

(54) SEMICONDUCTOR DEVICE AND METHOD FOR MANUFACTURING THE SAME

(75) Inventor: Mitsuhiko Kitagawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 13/234,061

(22) Filed: Sep. 15, 2011

(65) Prior Publication Data

US 2012/0074460 A1 Mar. 29, 2012

Related U.S. Application Data

(63) Continuation-in-part of application No. 13/052,011, filed on Mar. 18, 2011.

(30) Foreign Application Priority Data

Sep. 21, 2010 (JP) ................................. 2010-211036

(51) Int. Cl.
*H01L 29/66* (2006.01)
(52) U.S. Cl. .................. 257/139; 257/334; 257/E21.09; 257/E21.41; 438/270; 438/478
(58) Field of Classification Search .................. 257/139, 257/334, E21.09, E21.41, 29.262; 438/270, 438/478
See application file for complete search history.

(56) References Cited

U.S. PATENT DOCUMENTS

| | | | | |
|---|---|---|---|---|
| 3,257,626 A * | 6/1966 | Marinace et al. | ............ | 372/50.1 |
| 5,072,266 A * | 12/1991 | Bulucea et al. | ................ | 257/330 |
| 5,410,170 A * | 4/1995 | Bulucea et al. | ................ | 257/332 |
| 5,581,100 A * | 12/1996 | Ajit | ................................ | 257/331 |
| 5,828,101 A * | 10/1998 | Endo | ............................. | 257/330 |
| 6,525,375 B1 * | 2/2003 | Yamaguchi et al. | ........... | 257/341 |
| 6,696,323 B2 * | 2/2004 | Yamaguchi et al. | ........... | 438/138 |
| 6,867,456 B2 * | 3/2005 | Sakakibara | .................... | 257/330 |
| 6,960,507 B2 * | 11/2005 | Kim et al. | ...................... | 438/270 |
| 7,449,354 B2 * | 11/2008 | Marchant et al. | ................ | 438/39 |
| 7,553,722 B2 * | 6/2009 | Sakakibara et al. | ........... | 438/246 |
| 7,564,095 B2 * | 7/2009 | Urakami et al. | ................ | 257/330 |
| 7,750,377 B2 * | 7/2010 | Hoshino et al. | ................ | 257/263 |
| 7,772,642 B2 * | 8/2010 | Marchant | ....................... | 257/330 |
| 8,049,273 B2 * | 11/2011 | Lin et al. | ....................... | 257/330 |
| 2004/0089896 A1 * | 5/2004 | Sakakibara | .................... | 257/330 |
| 2007/0155104 A1 * | 7/2007 | Marchant et al. | ............. | 438/270 |
| 2007/0158740 A1 * | 7/2007 | Yoshikawa et al. | ........... | 257/330 |
| 2007/0215920 A1 * | 9/2007 | Zundel et al. | .................. | 257/288 |
| 2008/0012069 A1 * | 1/2008 | Mizokuchi | ..................... | 257/330 |
| 2008/0265279 A1 * | 10/2008 | Foerster | ......................... | 257/190 |
| 2010/0110753 A1 * | 5/2010 | Slesazeck et al. | ............. | 365/145 |
| 2010/0155833 A1 * | 6/2010 | Sumida et al. | ................. | 257/330 |
| 2010/0200915 A1 * | 8/2010 | Denison | ......................... | 257/335 |
| 2010/0289076 A1 * | 11/2010 | Nishida et al. | ................. | 257/334 |
| 2012/0039104 A1 * | 2/2012 | Lin et al. | .......................... | 365/63 |
| 2012/0068222 A1 * | 3/2012 | Kitagawa | ....................... | 257/139 |

FOREIGN PATENT DOCUMENTS

JP 2010-034572 2/2010

* cited by examiner

*Primary Examiner* — N Drew Richards
*Assistant Examiner* — Ankush Singal
(74) *Attorney, Agent, or Firm* — Patterson & Sheridan, LLP

(57) ABSTRACT

According to an embodiment, a semiconductor device includes a first trench being provided in an N⁺ substrate. An N layer, an N⁻ layer, a P layer, and an N⁺ layer are formed in a stacked manner to cover the first trench. The semiconductor device includes second and third trenches. The P⁺ layer is formed to cover the second trench. The trench gates are formed to cover the third trenches.

20 Claims, 24 Drawing Sheets

US 8,415,711 B2

SEMICONDUCTOR DEVICE AND METHOD FOR MANUFACTURING THE SAME

CROSS REFERENCE TO RELATED APPLICATION

This application is a continuation-in-part of U.S. patent application Ser. No. 13/052,011, filed on Mar. 18, 2011 and is based upon and claims the benefit of priority from the prior and Japanese Patent Application No. 2010-211036, filed on Sep. 21, 2010, the entire contents of which are incorporated herein by reference.

FIELD

Embodiments described herein relate to a semiconductor device and a method for manufacturing the same.

BACKGROUND

There have been developed a number of trench-type power MOS transistors and IGBTs (Insulated Gate Bipolar Transistors) capable of on-resistance reduction, speed-up, cell pitch reduction and the like. To reduce the substrate resistance or to increase the density of integration of unit elements, there have also been proposed three-dimensional trench gate power MOS transistors and IGBTs structured three-dimensionally.

The conventionally proposed three-dimensional trench gate power MOS transistor structure or three-dimensional trench gate IGBT structure requires complex control of internal carriers attributable to the complicated element structure of the three-dimensional trench gate. As a result, there arise problems such as reduction in breakdown tolerance of the element, reduction in an ASO (Area of Safe Operation: secondary breakdown tolerance of the element) and difficult control of a threshold voltage (Vth).

DETAILED DESCRIPTION

Figure 1:
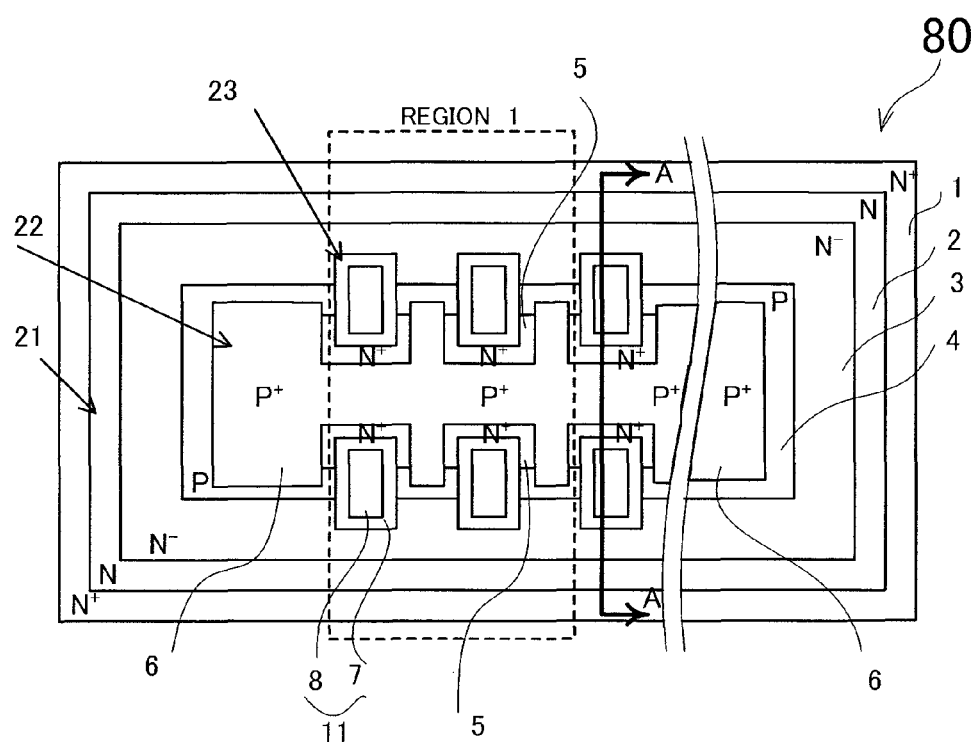
FIG. 1 is a plan view showing a trench power MOS transistor according to a first embodiment.

According to an embodiment, a semiconductor device includes a first trench, a first semiconductor layer, a second semiconductor layer, a third semiconductor layer, a second trench, a fourth semiconductor layer, third trenches and trench gates. The first trench is provided in a semiconductor substrate of a first conductivity type. The first semiconductor layer is of the first conductivity type and has an impurity concentration lower than that of the semiconductor substrate. The second semiconductor layer is of a second conductivity type. The third semiconductor layer is of the first conductivity type and has an impurity concentration higher than that of the first semiconductor layer. The first to third semiconductor layers are formed in a stacked manner to cover the first trench. The second trench is provided in the third semiconductor layer in such a manner that the second trench at least partially penetrates the third semiconductor layer to expose the second semiconductor layer in a vertical direction relative to a plane of the semiconductor substrate, and at least partially penetrates the third semiconductor layer to expose the second semiconductor layer in a horizontal direction relative to the plane of the semiconductor substrate. The fourth semiconductor layer is of the second conductivity type, has an impurity concentration higher than that of the second semiconductor layer, and is formed to cover the second trench. The third trenches are arranged between portions of the fourth semiconductor layer in such a manner as to be spaced apart from the side of the fourth semiconductor layer. The third trenches are provided so that each of the trenches penetrates the third semiconductor layer to expose the second semiconductor layer or penetrates the third and second semiconductor layers to expose the first semiconductor layer in the vertical direction relative to the plane of the semiconductor substrate, and so that each of the trenches penetrates the second semiconductor layer to expose the first semiconductor layer on one end or penetrates the second and first semiconductor layers to expose the semiconductor substrate on one end and to expose the third semiconductor layer on the other end in the horizontal direction relative to the plane of the semiconductor substrate. The trench gates are formed to cover the third trenches, and each of trench gates includes a gate insulating film and a gate electrode film which are formed in a stacked manner.

According to another embodiment, a method for manufacturing a semiconductor device includes first to eighth steps. The first step is to form a first trench in a semiconductor substrate of a first conductivity type, the first trench having a quadrangular prism shape elongated in a horizontal direction relative to a plane of the semiconductor substrate. The second step is to form a first semiconductor layer of the first conductivity type having an impurity concentration lower than that of the semiconductor substrate, a second semiconductor layer of a second conductivity type, and a third semiconductor layer of the first conductivity type having an impurity concentration higher than that of the first semiconductor layer, the first to third semiconductor layers being formed in a stacked manner to cover the first trench. The third step is to polish the first to third semiconductor layers to be flattened so that the semiconductor substrate is exposed. The fourth step is to form a second trench in the third semiconductor layer so that the second trench at least partially penetrates the third semiconductor layer to expose the second semiconductor layer in a vertical direction relative to the plane of the semiconductor substrate, and so that the second trench at least partially penetrates the third semiconductor layer to expose the second semiconductor layer in the horizontal direction relative to the plane of the semiconductor substrate. The fifth step is to form a fourth semiconductor layer of the second conductivity type having an impurity concentration higher than that of the second semiconductor layer so that the fourth semiconductor layer covers the second trench. The sixth step is to polish the fourth semiconductor layer to be flattened so that the semiconductor substrate is exposed. The seventh step is to form third trenches to be spaced apart from the fourth semiconductor layer so that each of the trenches penetrates the third and second semiconductor layers formed in the stacked manner to expose the first semiconductor layer in the vertical direction relative to the plane of the semiconductor substrate, and so that each of the trenches penetrates the second semiconductor layer to expose the first semiconductor layer or the semiconductor substrate on one end and to expose the third semiconductor layer on the other end in the horizontal direction relative to the plane of the semiconductor substrate. The eighth step is to form trench gates each including a gate insulating film and a gate electrode film so that the trench gates cover the third trenches.

Further embodiments are described below with reference to the drawings. In the drawings, the same reference numerals denote the same or similar portions.

Figure 2:
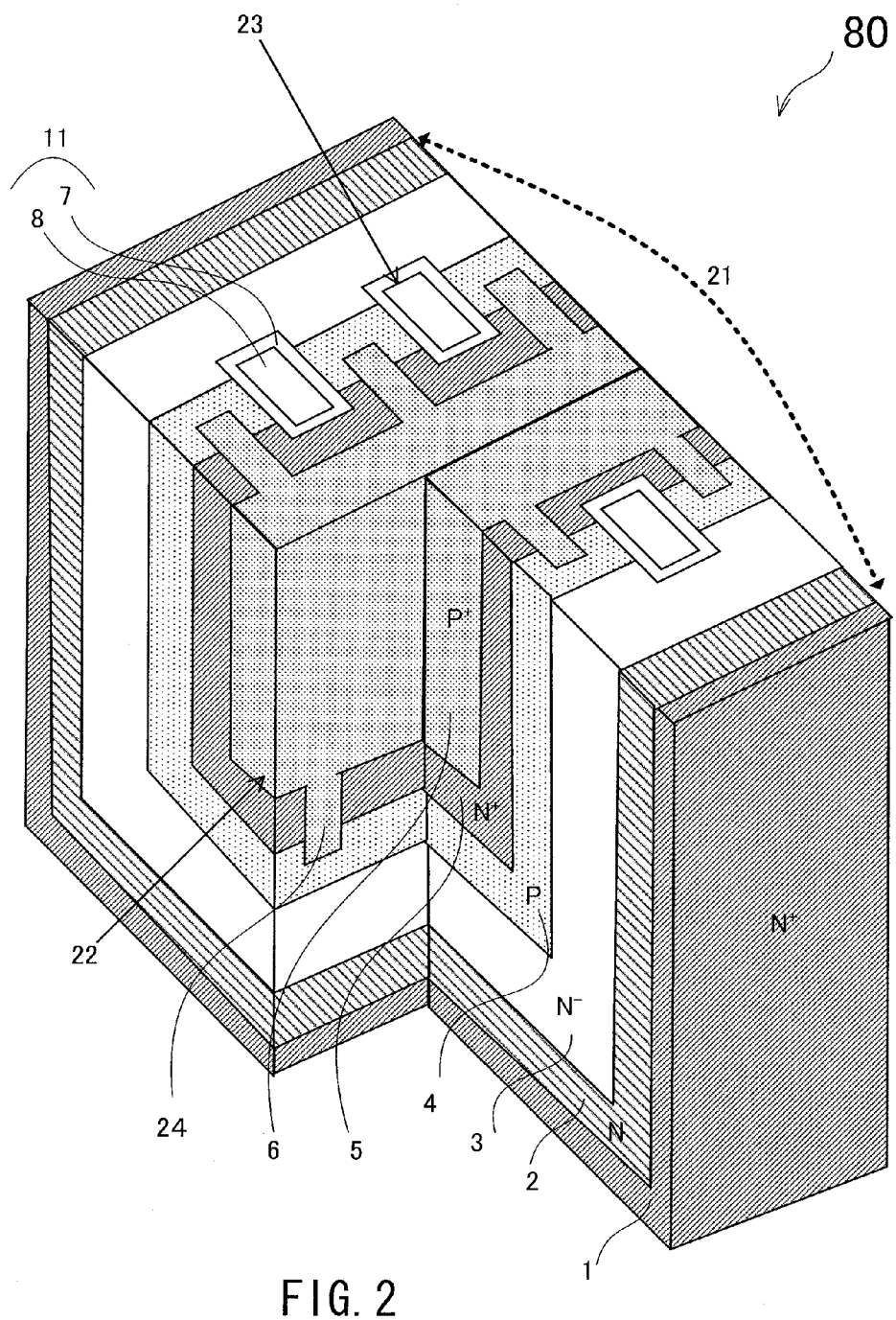
FIG. 2 is a cross-sectional perspective view of region 1 in FIG. 1.
Figure 3:
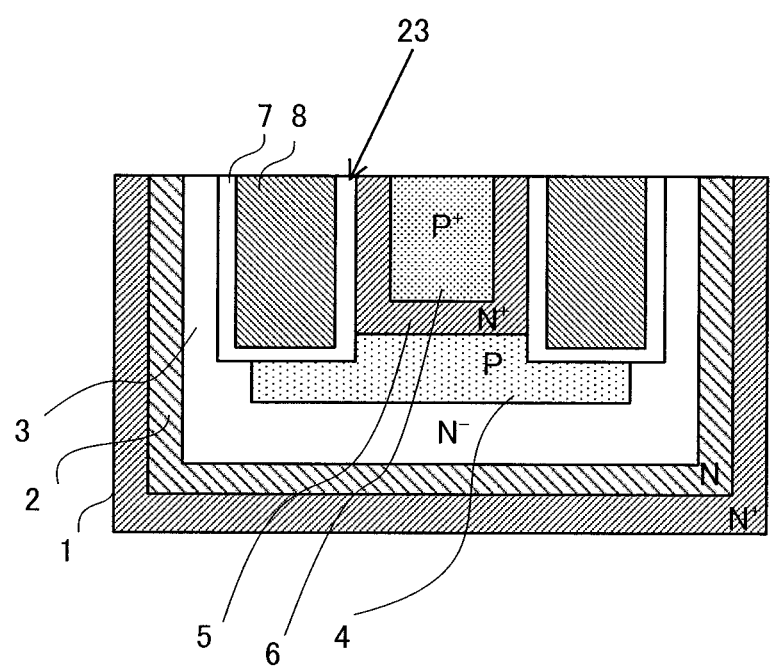
FIG. 3 is a cross-sectional view taken along the line A-A in FIG. 1.

A semiconductor device and a method for manufacturing the same according to a first embodiment are described with reference to the drawings. FIG. 1 is a plan view showing a trench power MOS transistor. FIG. 2 is a cross-sectional perspective view of region 1 in FIG. 1. FIG. 3 is a cross-sectional view taken along the line A-A in FIG. 1. In the embodiment, a $P^+$ carrier withdrawal layer is provided around a trench gate to improve breakdown tolerance of a three-dimensional N-channel trench power MOS transistor to be operated in a lateral direction.

As shown in FIG. 1, in a trench power MOS transistor 80, a stripe-shaped trench 21 (a first trench) is provided in an $N^+$ substrate 1 that is a drain layer. An N layer 2 that is an N drain layer, an $N^-$ layer 3 that is an $N^-$ drift layer, a P layer 4 to serve as a channel unit of the trench power MOS transistor 80, and an $N^+$ layer 5 that is a source layer are formed in a stacked manner to cover the trench 21.

In the $N^+$ layer 5, a trench 22 (a second trench) is provided to partially penetrate the $N^+$ layer 5 and reach the P layer 4. The trench 22 is formed to be wider at end portions of trench gates 11 (at left and right ends in FIG. 1) than in other portions in such a manner as to reach the P layer 4. In the trench 22, a $P^+$ layer 6 is provided to cover the trench 22.

In the P layer 4, rectangular trenches 23 (third trenches) are provided to penetrate the P layer 4 and to have one ends reach the $N^-$ layer 3 and the other ends reach the $N^+$ layer 5. The multiple trenches 23 (the third trenches) are arranged in two parallel rows in a horizontal direction relative to the $N^+$ substrate 1 that is the drain layer. The $P^+$ layer 6 is arranged between and on the side of the trenches 23 in such a manner as to be spaced apart from the trenches 23 by the $N^+$ layer 5.

In each of the trenches 23, the trench gate 11 including a gate insulating film 7 and a gate electrode 8 is provided to cover the trench 23.

The $N^+$ layer 5 is provided between the trench gates 11 and the $P^+$ layer 6. The $P^+$ layer 6 is provided between the $N^+$ layers 5 provided around the trench gates 11 and on the lateral side of the $N^+$ layers 5 at the end portions of the trench gates 11 (at the left and right ends in FIG. 1).

The trench power MOS transistor 80 is a 300-V three-dimensional N-channel trench gate power MOS transistor, for example. Here, the $P^+$ layer 6 functions as a $P^+$ carrier withdrawal layer to withdraw carriers (holes). The $P^+$ layer 6 as the $P^+$ carrier withdrawal layer will be described in detail later.

As shown in FIG. 2, in the $N^+$ substrate 1, the trench 21 is formed having a quadrangular prism shape elongated in the horizontal direction relative to the $N^+$ substrate 1. A drain electrode (not shown) is provided on the opposite side to the trench 21 in the $N^+$ substrate 1 that is the drain layer. The drain electrode is connected to the $N^+$ substrate 1.

In the trench 21 (the first trench), the N layer 2, the $N^-$ layer 3, the P layer 4 and the $N^+$ layer 5 are formed in a stacked manner to cover the trench 21. An impurity concentration of the N layer 2 that is the N drain layer is high on the side of the $N^+$ substrate 1, for example, and is set low on the side of the $N^-$ layer 3 that is the $N^-$ drift layer. The $N^-$ layer 3 that is the $N^-$ drift layer has a width set wider than that of the N layer 2, for example.

In the $N^+$ layer 5, the trench 22 (the second trench) having protrusion portions 24 is formed. Specifically, the protrusion portions 24 are formed in such a manner that the protrusion portions 24 partially penetrate the $N^+$ layer 5 to expose the surface of the P layer 4 in a vertical direction relative to a plane of the $N^+$ substrate 1, and partially penetrate the $N^+$ layer 5 to expose the side of the P layer 4 in the horizontal direction relative to the plane of the $N^+$ substrate 1.

In the trench 22, the $P^+$ layer 6 is provided to cover the trench 22. The $P^+$ layer 6 has a higher impurity concentration than the P layer 4.

In the P layer 4, the trenches 23 (the third trenches) having a quadrangular prism shape are provided, each of the trenches 23 formed in such a manner that the trench 23 penetrates the P layer 4 to expose the side of the N⁻ layer 3 on one end, and to expose the side of the N⁺ layer 5 on the other end in the horizontal direction relative to the plane of the N⁺ substrate 1. As shown in FIG. 3, the trenches 23 are provided in such a manner that the trenches 23 penetrate the N⁺ layer 5 to expose the surface of the P layer 4 in the vertical direction relative to the plane of the N⁺ substrate 1. The trenches 23 are arranged between portions of the P⁺ layer 6 in such a manner as to be spaced apart from the side of the P⁺ layer 6.

Although the trenches 23 are provided to expose the surface of the P layer 4 in the vertical direction relative to the plane of the N⁺ substrate 1, the trenches 23 may be provided in such a manner that the trenches 23 penetrate the N⁺ layer 5 and the P layer 4 to expose the surface of the N⁻ layer 3. Furthermore, although the trenches 23 are provided in such a manner that the trances 23 penetrate the P layer 4 to expose the side of the N⁻ layer 3 on one end in the horizontal direction relative to the plane of the N⁺ substrate 1, the trenches 23 may be provided in such a manner that the trenches 23 penetrate the P layer 4 and the N⁻ layer 3 to expose the side of the N layer 2 on one end.

In each of the trenches 23, the trench gate 11 including the gate insulating film 7 and the gate electrode 8 is provided to cover the trench 23. Here, a source electrode (not shown) is provided on the N⁺ layer 5 and the P⁺ layer 6. The source electrode is connected to the N⁺ layer 5 and the P⁺ layer 6.

Figure 4:
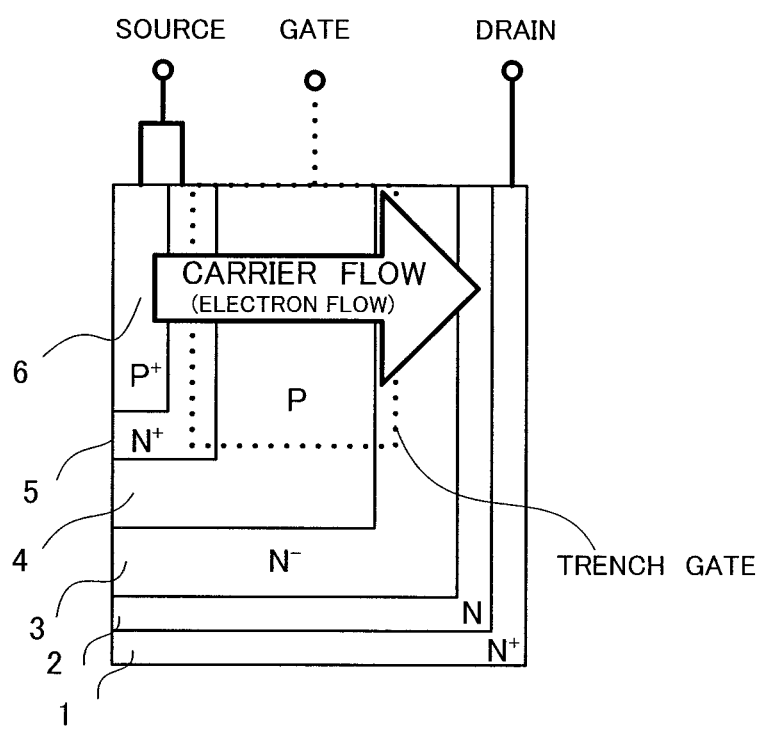
FIG. 4 is a view explaining a flow of carriers during operation of the trench power MOS transistor according to the first embodiment.

An operation of the trench power MOS transistor is described with reference to FIGS. 4 and 5. FIG. 4 is a view explaining a flow of carriers during operation of the trench power MOS transistor.

As shown in FIG. 4, the trench power MOS transistor 80 is turned on when a higher voltage source voltage (Vdd) is applied to the drain electrode and a "High" level signal is applied to the trench gate 11. In this event, an inversion layer is formed in a side portion, of the trench gate 11, in contact with the P layer 4 in the vertical direction relative to the semiconductor substrate 1. Thus, carriers flow from the source electrode to the drain electrode. The side portion is preferably set to be a {100} plane, for example, in which electron mobility is higher than in other plane directions.

The P layer 4 is provided immediately below the trench gate 11. Thus, although not shown, the inversion layer is also formed immediately below the trench gate 11. The depth of the trench gate 11 in the vertical direction is larger than the width of the trench gate 11 in the horizontal direction with respect to the N⁺ substrate 1. Accordingly, there is less influence (contribution to the drain current) of the inversion layer immediately below the trench gate 11.

Figure 5:
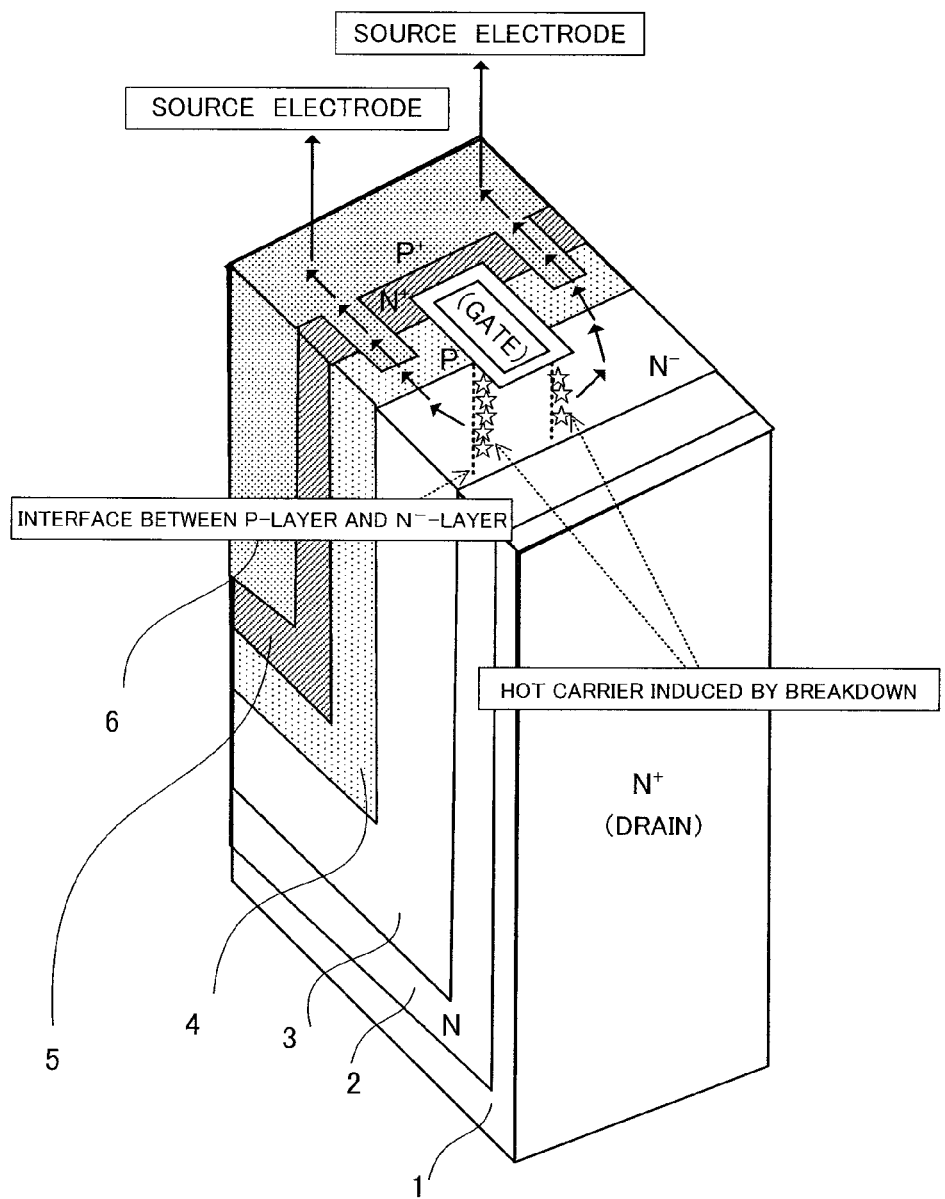
FIG. 5 is a view explaining a flow of carriers induced by breakdown of the trench power MOS transistor according to the first embodiment.

FIG. 5 is a view explaining a flow of carriers induced by breakdown of the trench power MOS transistor.

As shown in FIG. 5, when a high voltage is applied to the drain side of the trench power MOS transistor 80, a junction between the N⁻ layer 3 that is the N⁻ drift layer and the P layer 4 breaks down. In this event, carriers are generated in the side portion of the trench gate 11 (in the N⁻ layer 3 near the junction) in the vertical direction relative to the N⁺ substrate 1.

The holes which are the carriers generated by the breakdown are discharged from the source electrode 11 after flowing in the horizontal direction relative to the N⁺ substrate 1 from the P layer 4 to the P⁺ layer 6 that is the P⁺ carrier withdrawal layer for the protrusion portions 24, and then to the source electrode.

As described above, the carriers generated by the breakdown are quickly discharged from the source electrode through the P⁺ layer 6. As a result, operation of a parasitic npn bipolar transistor (the N⁻ layer 3 side is a collector, the P layer 4 is a base, and the N⁺ layer 5 side is an emitter) can be significantly suppressed. Therefore, reduction in an output breakdown voltage (avalanche tolerance) is suppressed, thereby enabling a high output breakdown voltage (avalanche tolerance) to be secured.

As a result, reduction in breakdown tolerance of the trench power MOS transistor 80 can be prevented. Moreover, reduction in an ASO (Area of Safe Operation: secondary breakdown tolerance of the element) of the trench power MOS transistor 80 can be prevented. Furthermore, carriers not required for the operation are quickly withdrawn, thereby facilitating the control of a threshold voltage (Vth).

Next, a method for manufacturing the trench power MOS transistor is described with reference to FIGS. 6 to 12. FIGS. 6 to 11 are cross-sectional views showing steps of manufacturing the trench power MOS transistor. FIG. 12 is a cross-sectional perspective view showing a step of manufacturing the trench power MOS transistor.

Figure 6:
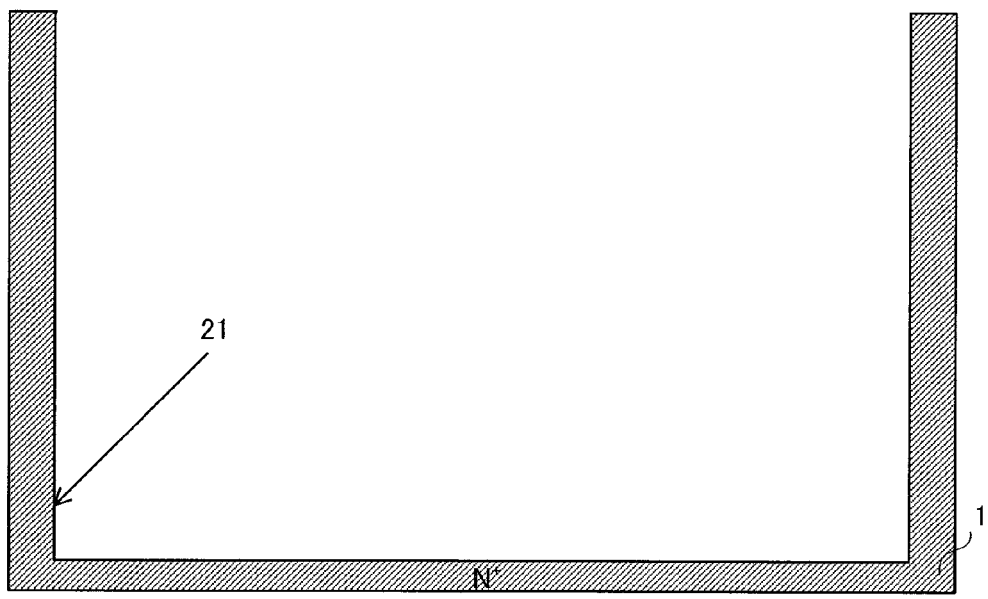
FIG. 6 is a cross-sectional view showing a step of manufacturing a trench power MOS transistor according to the first embodiment.

As shown in FIG. 6, first, a resist film (not shown) is formed, using a well-known lithography technique, on an N⁺ substrate 1 that is a silicon substrate heavily-doped with N-type impurities. The resist film is used as a mask to form a trench 21 in the N⁺ substrate 1 using an RIE (Reactive Ion Etching) method. After the resist film is peeled off, a damaged layer and the like are removed by carrying out post-RIE treatment.

Figure 7:
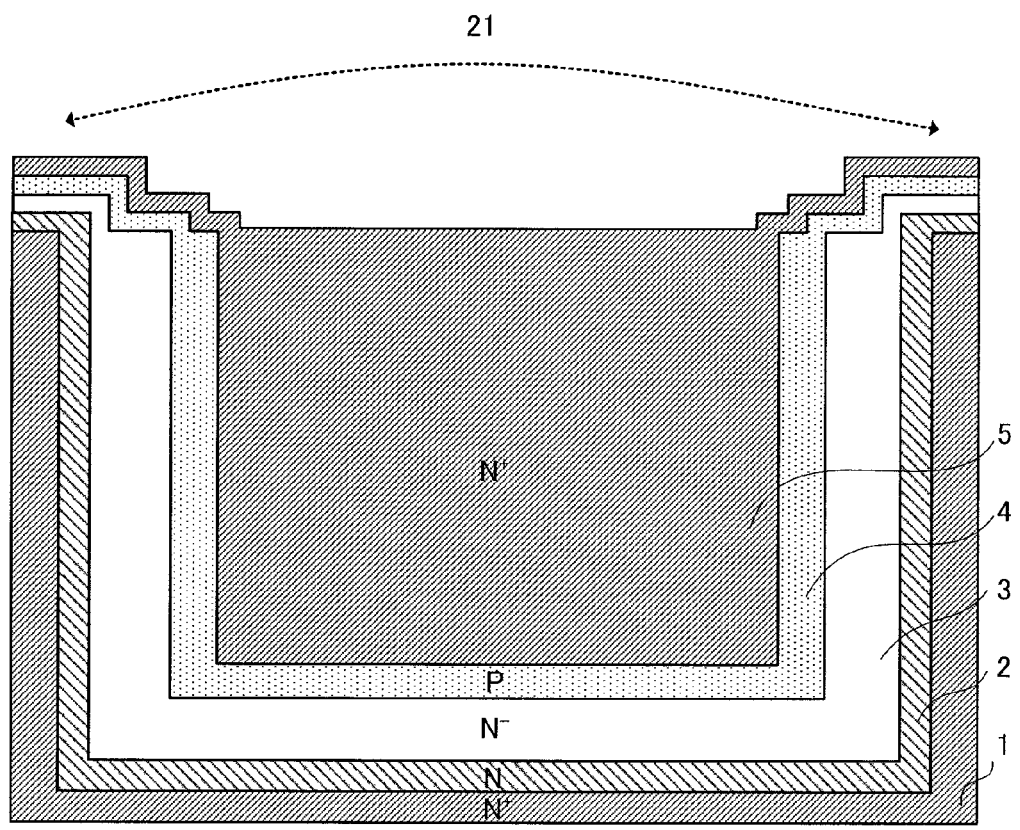
FIG. 7 is a cross-sectional view showing a step of manufacturing a trench power MOS transistor according to the first embodiment.

Next, as shown in FIG. 7, an N layer 2, an N⁻ layer 3, a P layer 4 and an N⁺ layer 5 are sequentially formed in a stacked manner on the trench 21 and the N⁺ substrate 1 using a silicon epitaxial growth method, for example.

For epitaxial growth of the N layer 2, a relatively low temperature condition is preferably used, which hinders auto-doping of the high concentration of impurities in the N⁺ substrate 1. When the auto-doping occurs, the impurity concentration of the N layer 2 on the N⁺ substrate 1 side is increased. Moreover, for epitaxial growth of the N⁺ layer 5, a relatively low temperature condition is preferably used, which hinders auto-doping of the high concentration of impurities in the film. When the auto-doping occurs, the impurity concentration of the P layer 4 on the N⁺ substrate 1 side is reduced.

Figure 8:
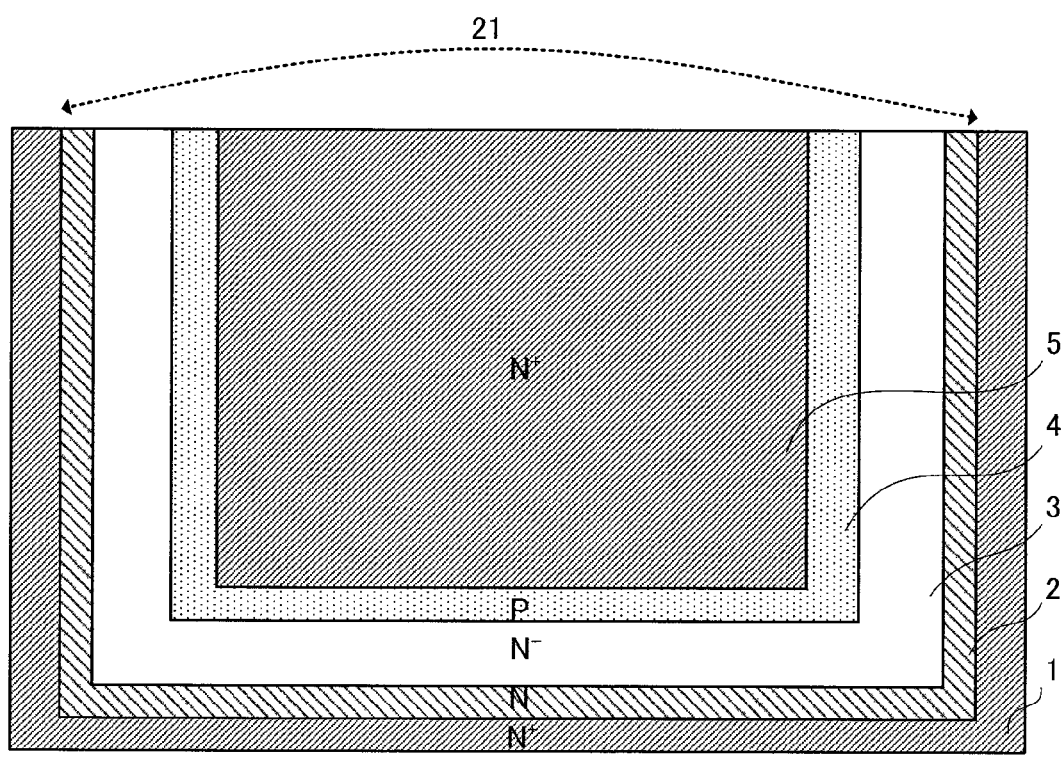
FIG. 8 is a cross-sectional view showing a step of manufacturing a trench power MOS transistor according to the first embodiment.

Subsequently, as shown in FIG. 8, the N⁺ layer 5, the P layer 4, the N⁻ layer 3 and the N layer 2 are polished to be flattened, using a CMP (Chemical Mechanical Polishing) method, for example, until the surface of the N⁺ substrate 1 is exposed. After the CMP treatment, residues, a damaged layer and the like are removed by carrying out post-CMP treatment.

Figure 9:
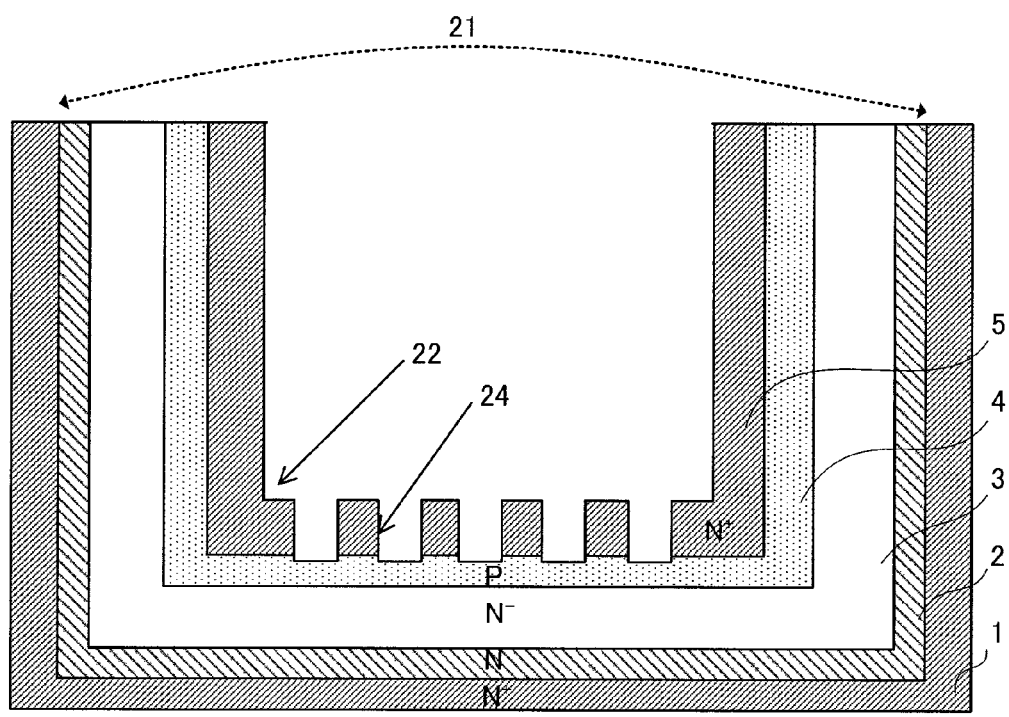
FIG. 9 is a cross-sectional view showing a step of manufacturing a trench power MOS transistor according to the first embodiment.

Then, as shown in FIG. 9, a resist film (not shown) is formed using a well-known lithography technique. The resist film is used as a mask to form a trench 22 in the N⁺ substrate 5 using the RIE method. After the resist film is removed, another resist film (not shown) is formed again. The resist film is used as a mask to form, using the RIE method, for example, protrusion portions 24 which penetrate the N⁺ layer 5 to expose the surface of the P layer 4. After the resist film is peeled off, a damaged layer and the like are removed by carrying out post-RIE treatment.

Figure 10:
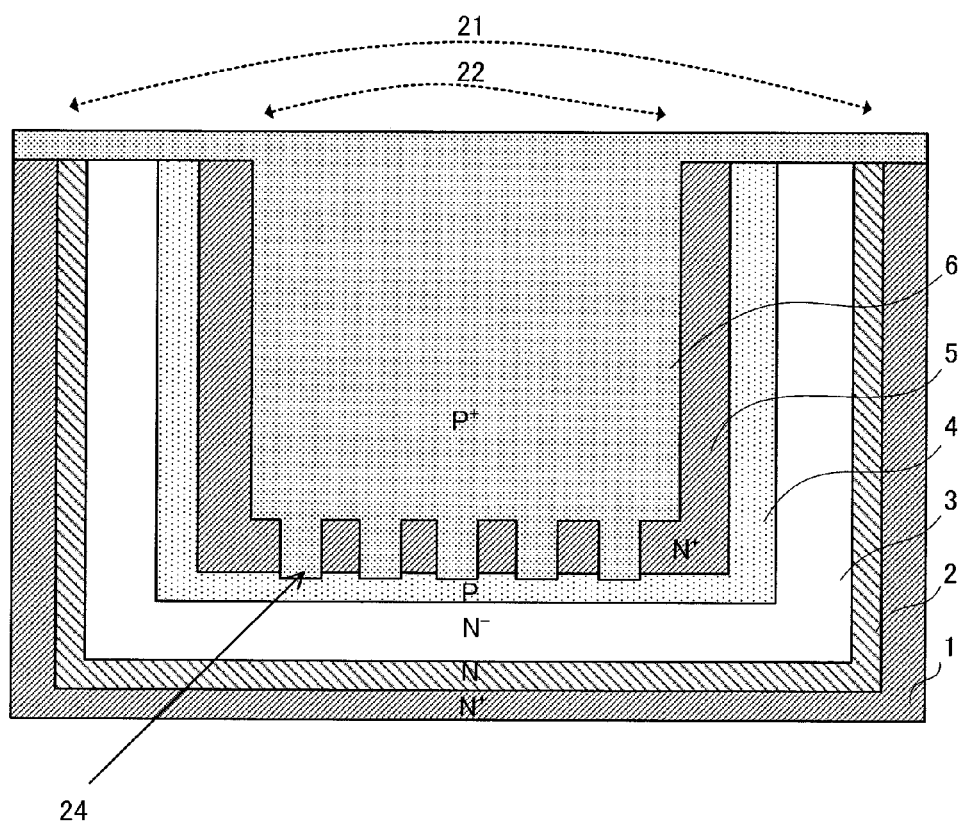
FIG. 10 is a cross-sectional view showing a step of manufacturing a trench power MOS transistor according to the first embodiment.

Next, as shown in FIG. 10, a P⁺ layer 6 is formed on a trench 22, the N⁺ layer 5, the P layer 4, the N⁻ layer 3, the N layer 2, and the N⁺ substrate 1 in such a manner as to cover the trench 22 using the silicon epitaxial growth method, for example.

Figure 11:
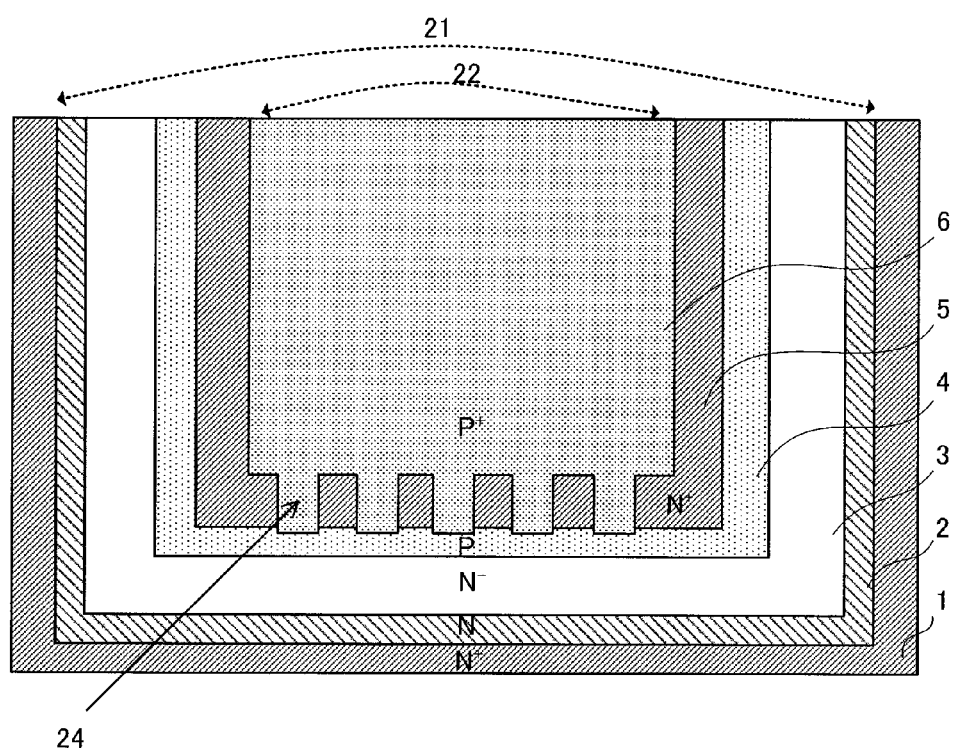
FIG. 11 is a cross-sectional view showing a step of manufacturing a trench power MOS transistor according to the first embodiment.
Figure 12:
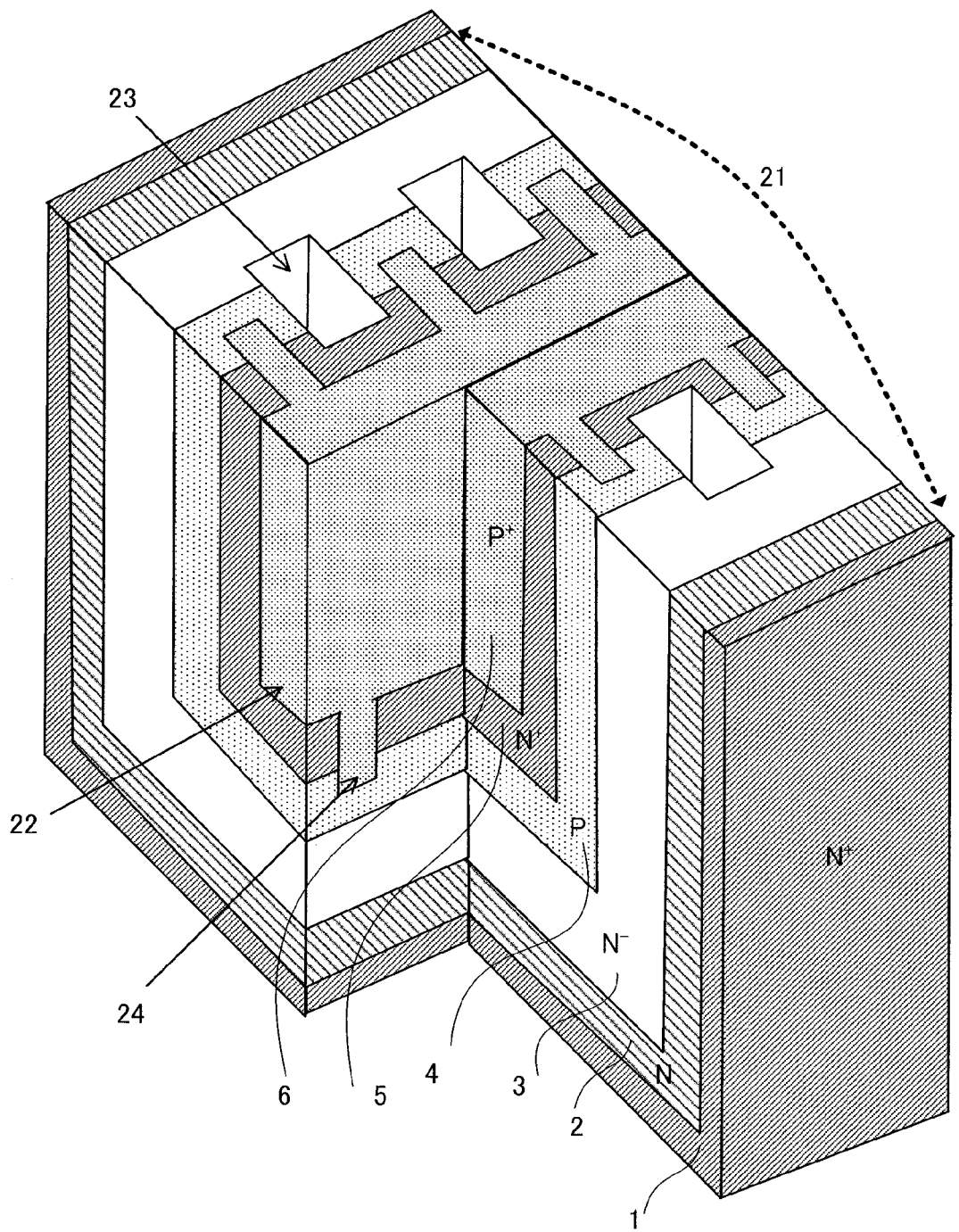
FIG. 12 is a cross-sectional perspective view showing a step of manufacturing a trench power MOS transistor according to the first embodiment.

Thereafter, as shown in FIG. 11, the P⁺ layer 6 is polished to be flattened, using the CMP method, for example, until the surface of the N⁺ substrate 1 is exposed. After the CMP treatment, residues, a damaged layer and the like are removed by carrying out post-CMP treatment.

Then, as shown in FIG. 12, a resist film (not shown) is formed using a well-known lithography technique. The resist film is used as a mask to form, using the RIE method, for example, trenches 23 in the P layer 4 so that each of the trenches penetrates the P layer 4 to expose the side of the N$^-$ layer 3 on one end and to expose the side of the N$^+$ layer 5 on the other end in the horizontal direction relative to the N$^+$ substrate 1, and so that an end portion of each of the trenches penetrates the N$^+$ layer 5 to expose the surface of the P layer 4 in the vertical direction relative to the N$^+$ substrate 1. After the resist film is peeled off, a damaged layer and the like are removed by carrying out post-RIE treatment.

The subsequent steps of forming trench gates, insulating films, contacts, metal wires, and the like are performed using well-known techniques, thus completing a trench power MOS transistor 80.

As described above, in the semiconductor device and the method for manufacturing the same according to the embodiment, the trench 21 is provided in the N$^+$ substrate 1. In the trench 21, the N layer 2, the N$^-$ layer 3, the P layer 4 and the N$^+$ layer 5 are formed in a stacked manner to cover the trench 21. In the N$^+$ layer 5, the trench 22 is formed in such a manner that the trench 22 partially penetrates the N$^+$ layer 5 to expose the surface of the P layer 4 in the vertical direction relative to the N$^+$ substrate 1, and partially penetrates the N$^+$ layer 5 to expose the side of the P layer 4 in the horizontal direction relative to the N$^+$ substrate 1. In the trench 22, the P$^+$ layer 6 is provided to cover the trench 22. The trenches 23 arranged between portions of the P$^+$ layers 6 in such a manner as to be spaced apart from the side of the P$^+$ layer 6 are provided so that each of the trenches penetrates the N$^+$ layer 5 to expose the surface of the P layer 4 in the vertical direction relative to the N$^+$ substrate 1, and so that each of the trenches penetrates the P layer 4 to expose the side of the N$^-$ layer 3 on one end and to expose the side of the N$^+$ layer 5 on the other end in the horizontal direction relative to the N$^+$ substrate 1. In each of the trenches 23, the trench gate 11 is provided to cover the trench 23. The P$^+$ layer 6 quickly withdraws, to the source electrode side, the carriers generated by the breakdown of the trench power MOS transistor 80.

Thus, the breakdown tolerance of the trench power MOS transistor 80 can be improved. Moreover, the ASO of the trench power MOS transistor 80 can be increased. Furthermore, carriers not required for the operation are quickly withdrawn, thereby facilitating the control of the threshold voltage (Vth) of the trench power MOS transistor 80.

Note that, in the embodiment, the P$^+$ layer 6 is provided around the trench gate, the P$^+$ layer 6 being the P$^+$ carrier withdrawal layer to withdraw to the source side the holes generated in a three-dimensional N-channel trench gate power MOS transistor. In the case of a three-dimensional P-channel trench gate power MOS transistor, an N$^+$ layer is preferably provided around a trench gate, the N$^+$ layer being an N$^+$ carrier withdrawal layer to withdraw electrons to be generated to the source side. While the N layer 2 and the N$^-$ layer 3 are formed in a stacked manner on the N$^+$ substrate, only an N layer may be provided in the case of a low-voltage three-dimensional N-channel trench gate power MOS transistor, for example.

Figure 13:
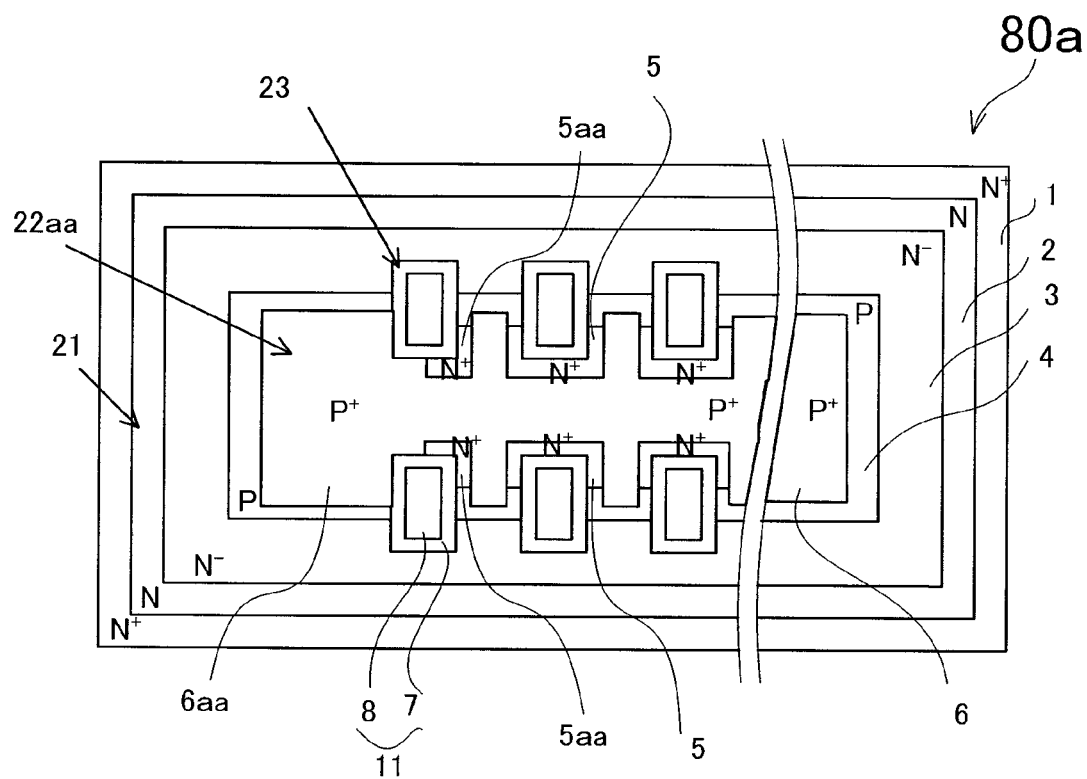
FIG. 13 is a plan view showing a modification of the trench power MOS transistor according to the first embodiment.

While the N$^+$ layer 5 is provided between the trench gate 11 and the P$^+$ layer 6 (the plan view shown in FIG. 1), the N$^+$ layers 5 at the end side may be partially omitted as shown in FIG. 13 to modify the shape of a trench 22$aa$ so that a P$^+$ layer 6$aa$ comes into contact with trench gates 11, thus obtaining a trench power MOS transistor 80$a$ having N$^+$ layers 5$aa$ provided at the end side.

Figure 14:
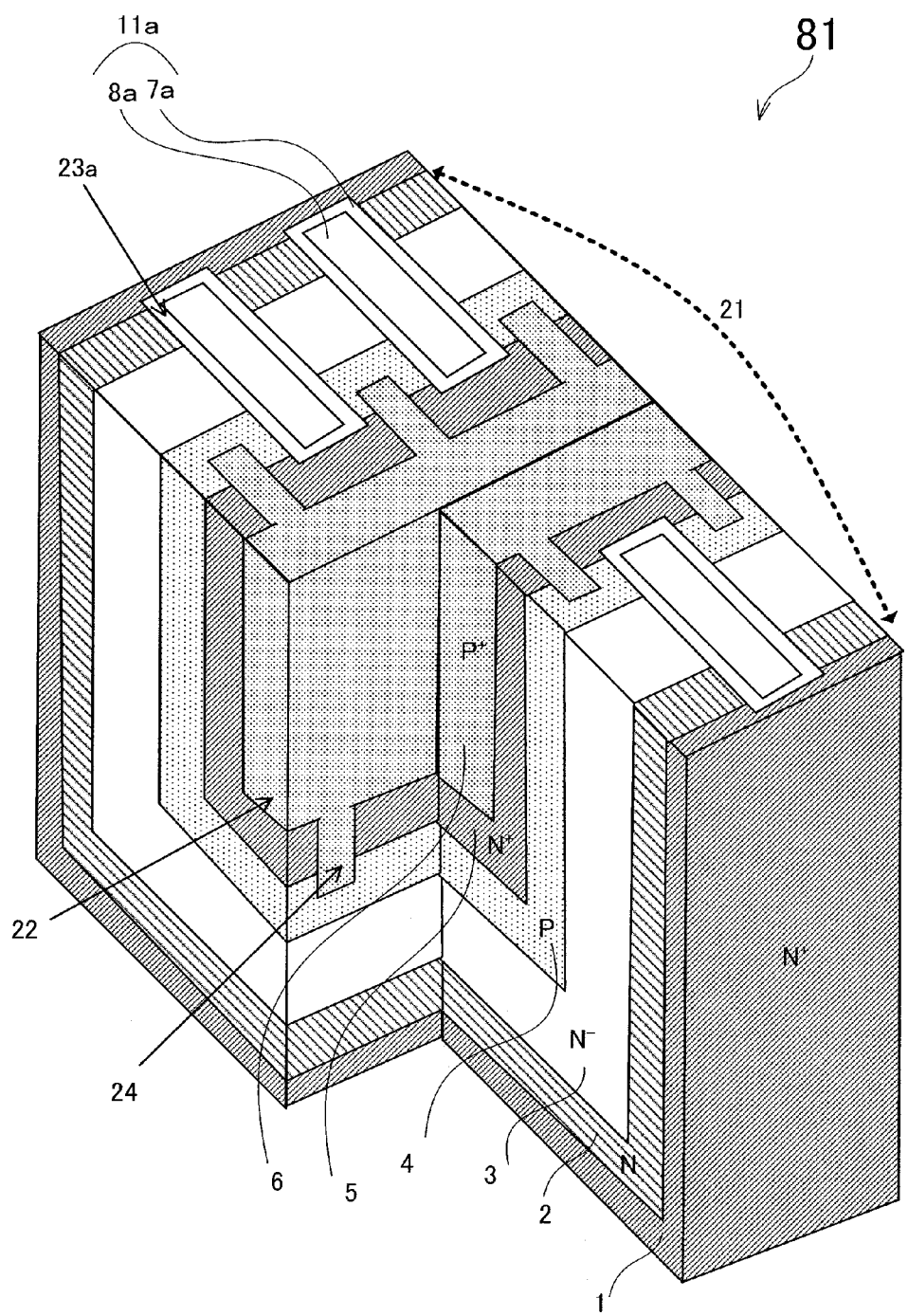
FIG. 14 is a cross-sectional perspective view showing a trench power MOS transistor according to a second embodiment.

A semiconductor device according to a second embodiment is described with reference to the drawings. FIG. 14 is a cross-sectional perspective view showing a trench power MOS transistor. In the embodiment, a trench gate of a three-dimensional N-channel trench power MOS transistor is provided between an N$^+$ source layer and an N$^+$ drain layer.

The same constituent portions as those of the first embodiment are denoted by the same reference numerals below. In the following, description of the same constituent portions is omitted, and only different portions are described.

As shown in FIG. 14, a trench power MOS transistor 81 is a 300-V three-dimensional N-channel trench gate power MOS transistor, for example.

In a P layer 4, an N$^-$ layer 3 and an N layer 2, trenches 23$a$ (third trenches) having a quadrangular prism shape are provided, each of the trenches 23$a$ formed in such a manner that the trench 23$a$ penetrates the P layer 4, the N$^-$ layer 3 and the N layer 2 to expose the side of an N$^+$ substrate 1 on one end, and to expose the side of an N$^+$ layer 5 on the other end in the horizontal direction relative to the plane of the N$^+$ substrate 1. The trenches 23$a$ are provided so that end portions penetrate the N$^+$ layer 5 to expose the surface of the P layer 4 in the vertical direction relative to the plane of the N$^+$ substrate 1. The trenches 23$a$ are arranged between portions of the P$^+$ layer 6 in such a manner as to be spaced apart from the side of the P$^+$ layer 6. The P$^+$ layer 6 that is a P$^+$ carrier withdrawal layer functions in the same manner as that of the first embodiment.

Although the trenches 23$a$ are provided to expose the surface of the P layer 4 in the vertical direction relative to the plane of the N$^+$ substrate 1, the trenches 23$a$ may be provided in such a manner that the trenches 23$a$ penetrates the N$^+$ layer 5 and the P layer 4 to expose the surface of the N$^-$ layer 3.

In each of the trenches 23$a$, a trench gate 11$a$ including a gate insulating film 7$a$ and a gate electrode 8$a$ is provided to cover the trench 23$a$. The trench gate 11$a$ is provided between the N$^+$ layer 5 that is an N$^+$ source layer and the N$^+$ substrate 1 that is an N$^+$ drain layer.

Note that the trench power MOS transistor 81 is manufactured using the same manufacturing method as that in the first embodiment.

As described above, in the semiconductor device according to the embodiment, the trench 21 is provided in the N$^+$ substrate 1. In the trench 21, the N layer 2, the N$^-$ layer 3, the P layer 4 and the N$^+$ layer 5 are formed in a stacked manner to cover the trench 21. In the N$^+$ layer 5, the trench 22 is formed in such a manner that the trench 22 partially penetrates the N$^+$ layer 5 to expose the surface of the P layer 4 in the vertical direction relative to the N$^+$ substrate 1, and partially penetrates the N$^+$ layer 5 to expose the side of the P layer 4 in the horizontal direction relative to the N$^+$ substrate 1. In the trench 22, the P$^+$ layer 6 is provided to cover the trench 22. The trenches 23$a$ arranged between portions of the P$^+$ layer 6 in such a manner as to be spaced apart from the side of the P$^+$ layer 6 are provided so that each of the trenches penetrates the N$^+$ layer 5 to expose the surface of the P layer 4 in the vertical direction relative to the N$^+$ substrate 1, and so that each of the trenches penetrates the P layer 4, the N$^-$ layer 3 and the N layer 2 to expose the side of the N$^+$ substrate 1 on one end and to expose the side of the N$^+$ layer 5 on the other end in the horizontal direction relative to the N$^+$ substrate 1. In each of the trenches 23$a$, the trench gate 11$a$ is provided to cover the trench 23$a$. The P$^+$ layer 6 quickly withdraws, to the source electrode side, the carriers generated by the breakdown of the trench power MOS transistor 81.

Thus, breakdown tolerance of the trench power MOS transistor 81 can be improved. Moreover, an ASO of the trench power MOS transistor 81 can be increased. Furthermore, carriers not required for the operation are quickly withdrawn, thereby facilitating the control of a threshold voltage (Vth) of the trench power MOS transistor 81.

A semiconductor device and a method for manufacturing the same according to a third embodiment are described with reference to the drawings. In the embodiment, the shape of a $P^+$ carrier withdrawal layer is modified.

The same constituent portions as those of the first embodiment are denoted by the same reference numerals below. In the following, description of the same constituent portions is omitted, and only different portions are described.

Figure 15:
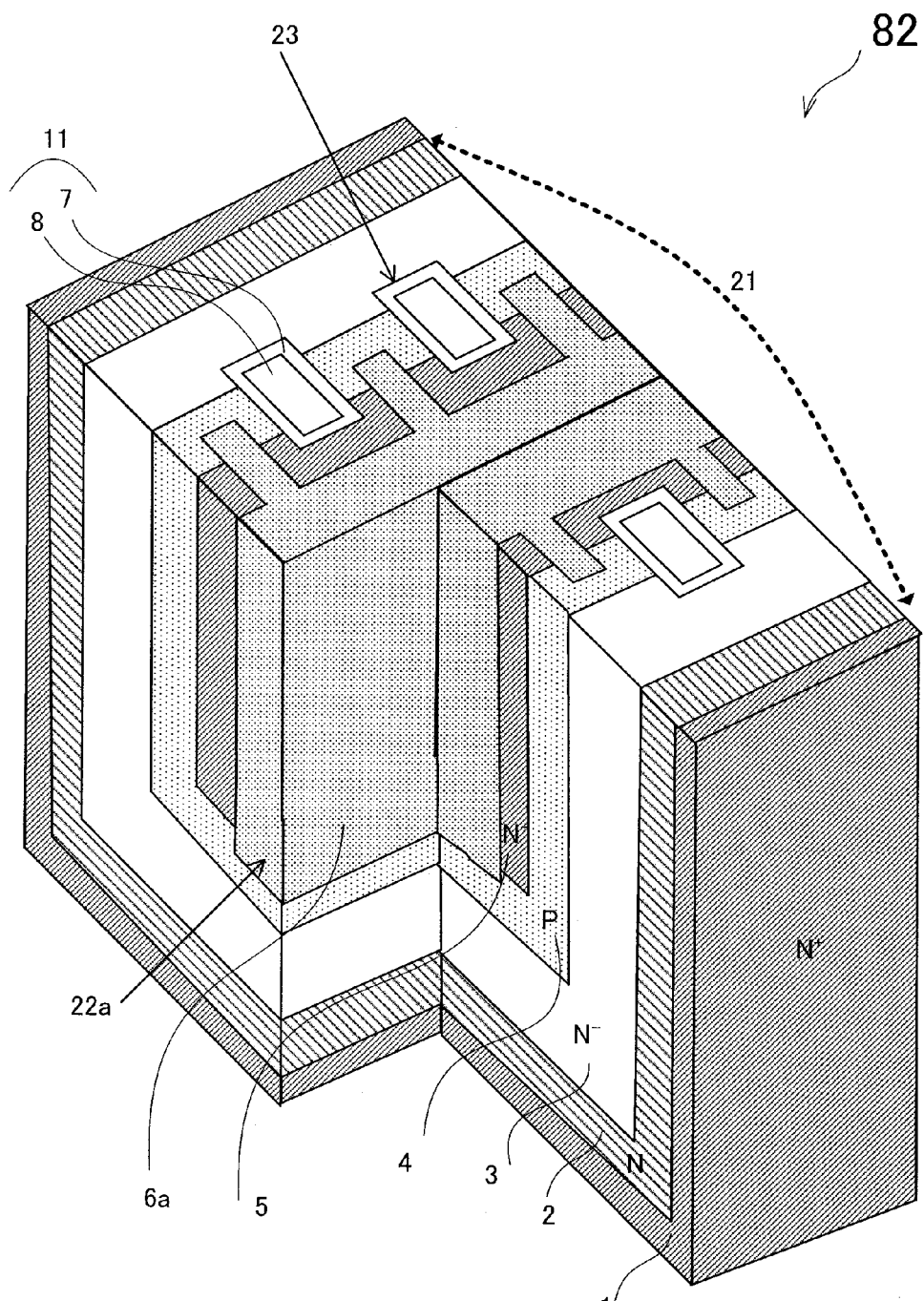
FIG. 15 is a cross-sectional perspective view showing a trench power MOS transistor according to a third embodiment.

As shown in FIG. 15, a trench power MOS transistor 82 is a 300-V three-dimensional N-channel trench gate power MOS transistor, for example.

In an $N^+$ layer 5, a trench 22$a$ (a second trench) is provided, which is formed in such a manner that the trench 22$a$ penetrates the $N^+$ layer 5 to expose the surface of a P layer 4 in the vertical direction relative to the plane of the $N^+$ substrate 1, and partially penetrates the $N^+$ layer 5 to expose the side of the P layer 4 in the horizontal direction relative to the plane of the $N^+$ substrate 1.

In the trench 22$a$, a $P^+$ layer 6$a$ that is the $P^+$ carrier withdrawal layer is provided to cover the trench 22$a$. The $P^+$ layer 6$a$ has a higher impurity concentration than the P layer 4. The $P^+$ layer 6$a$ that is the $P^+$ carrier withdrawal layer functions in the same manner as that of the first embodiment.

Figure 16:
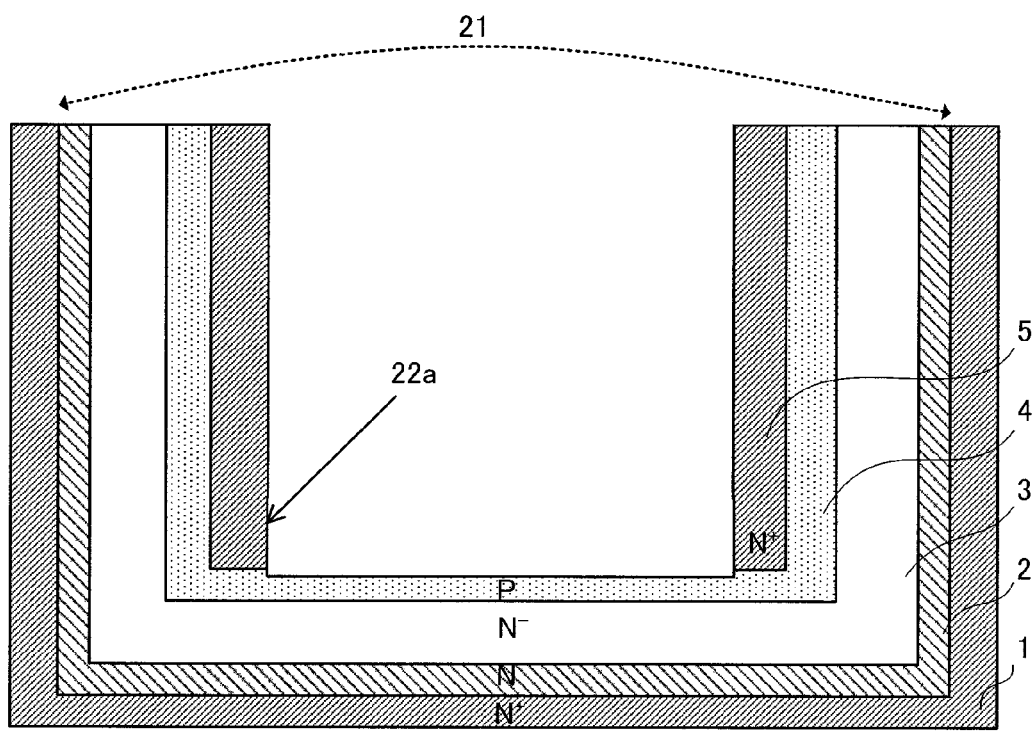
FIG. 16 is a cross-sectional view showing a step of manufacturing a trench power MOS transistor according to the third embodiment.

Next, a method for manufacturing the trench power MOS transistor is described with reference to FIG. 16. FIG. 16 is a cross-sectional view showing a step of manufacturing a trench power MOS transistor.

As shown in FIG. 16, a resist film (not shown) is formed using a well-known lithography technique. The resist film is used as a mask to form the trench 22$a$ (the second trench) in such a manner that the trenches 22$a$ penetrates the $N^+$ layer 5 to expose the surface of a P layer 4, using an RIE method. After the resist film is peeled off, a damaged layer and the like are removed by carrying out post-RIE treatment. The subsequent manufacturing steps are the same as those in the first embodiment, and thus description of such manufacturing steps is omitted.

As described above, in the semiconductor device and the method for manufacturing the same according to the embodiment, the trench 21 is provided in the $N^+$ substrate 1. In the trench 21, the N layer 2, the $N^-$ layer 3, the P layer 4 and the $N^+$ layer 5 are formed in a stacked manner to cover the trench 21. In the $N^+$ layer 5, the trench 22$a$ is formed in such a manner that the trench 22$a$ penetrates the $N^+$ layer 5 to expose the surface of the P layer 4 in the vertical direction relative to the $N^+$ substrate 1, and partially penetrates the $N^+$ layer 5 to expose the side of the P layer 4 in the horizontal direction relative to the $N^+$ substrate 1. In the trench 22$a$, the $P^+$ layer 6$a$ is provided to cover the trench 22$a$. The trenches 23 arranged between portions of the $P^+$ layer 6 in such a manner as to be spaced apart from the side of the $P^+$ layer 6 are provided so that each of the trenches penetrates the $N^+$ layer 5 to expose the surface of the P layer 4 in the vertical direction relative to the $N^+$ substrate 1, and so that each of the trenches penetrates the P layer 4 to expose the side of the $N^-$ layer 3 on one end and to expose the side of the $N^+$ layer 5 on the other end in the horizontal direction relative to the $N^+$ substrate 1. In each of the trenches 23, the trench gate 11 is provided to cover the trench 23. The $P^+$ layer 6$a$ quickly withdraws, to the source electrode side, the carriers generated by the breakdown of the trench power MOS transistor 82.

Thus, breakdown tolerance of the trench power MOS transistor 82 can be improved. Moreover, an ASO of the trench power MOS transistor 82 can be increased. Furthermore, carriers not required for the operation are quickly withdrawn, thereby facilitating the control of a threshold voltage (Vth) of the trench power MOS transistor 82.

Figure 17:
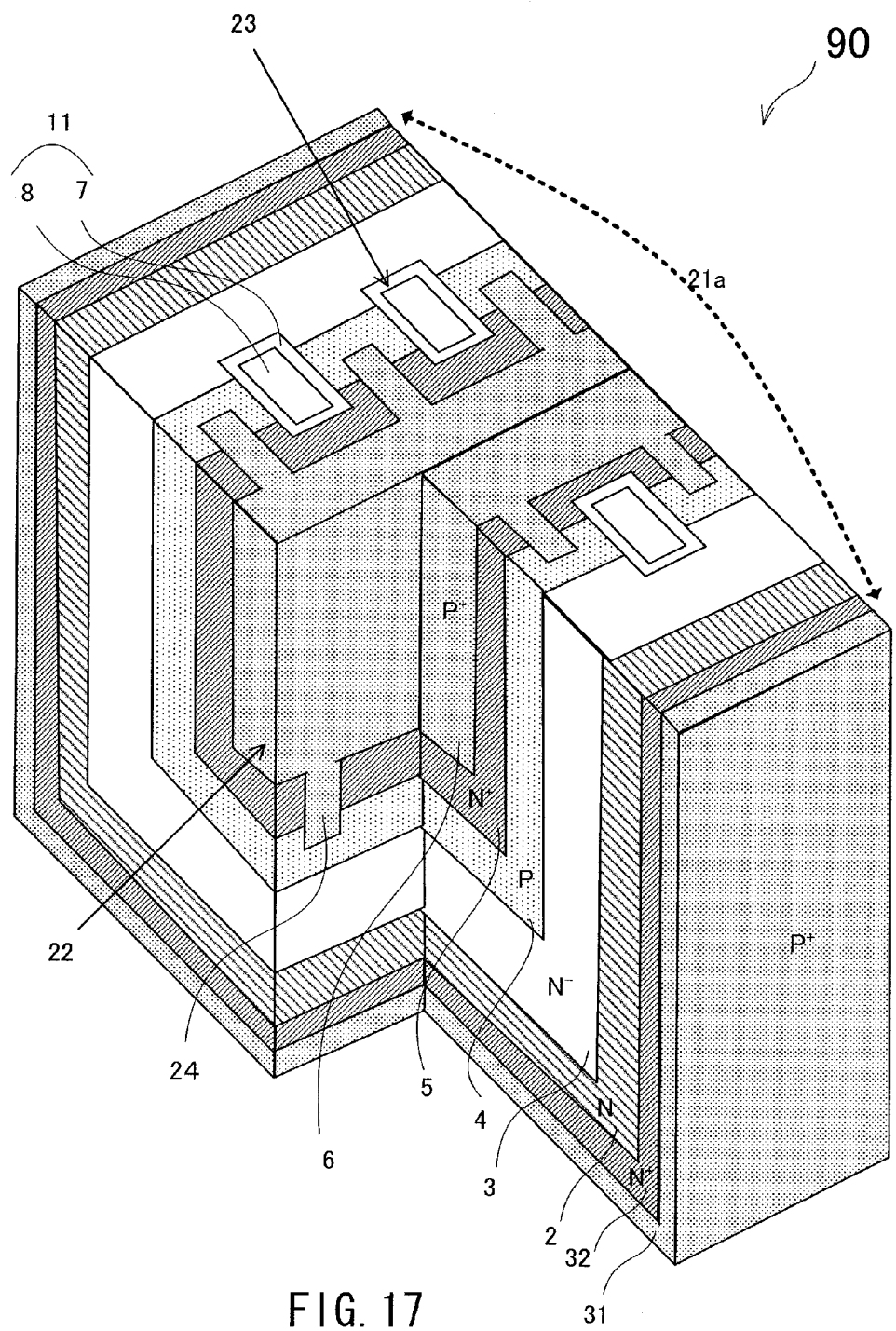
FIG. 17 is a cross-sectional perspective view showing an IGBT according to a fourth embodiment.

A semiconductor device according to a fourth embodiment is described with reference to the drawings. FIG. 17 is a cross-sectional perspective view showing an IGBT. In the embodiment, a $P^+$ carrier withdrawal layer is provided around a trench gate to improve breakdown tolerance of a three-dimensional IGBT to be operated in a lateral direction.

The same constituent portions as those of the first embodiment are denoted by the same reference numerals below. In the following, description of the same constituent portions is omitted, and only different portions are described.

As shown in FIG. 17, an IGBT (Insulated Gate Bipolar Transistor) 90 is a three-dimensional trench gate IGBT.

In a $P^+$ substrate 31 that is a $P^+$ collector layer, a trench 21$a$ is provided having a quadrangular prism shape elongated in the horizontal direction relative to the $P^+$ substrate 31. A collector electrode (not shown) is provided on the opposite side to the trench 21$a$ in the $P^+$ substrate 31. The collector electrode is connected to the $P^+$ substrate 31.

In the trench 21$a$ (the first trench), an $N^+$ layer 32 that is an $N^+$ collector, an N layer 2 that is an N buffer layer, an $N^-$ layer 3 that is an $N^-$ base layer, a P layer 4 that is a first P base layer, and an $N^+$ layer 5 that is an emitter layer are formed in a stacked manner to cover the trench 21$a$.

In an $N^+$ layer 5, a trench 22 (a second trench) having protrusion portions 24 is provided, which is formed in such a manner that the trench 22 partially penetrates the $N^+$ layer 5 to expose the surface of a P layer 4 in the vertical direction relative to the plane of the $P^+$ substrate 31, and partially penetrates the $N^+$ layer 5 to expose the side of the P layer 4 in the horizontal direction relative to the plane of the $P^+$ substrate 31.

In the trench 22, a $P^+$ layer 6 that is a second P base layer is provided to cover the trench 22. The $P^+$ layer 6 has a higher impurity concentration than the P layer 4. The $P^+$ layer 6 that is the $P^+$ carrier withdrawal layer functions in the same manner as that of the first embodiment.

In the P layer 4, trenches 23 (third trenches) having a quadrangular prism shape are provided, each of the trenches 23 formed in such a manner that the trench 23 penetrates the P layer 4 to expose the side of the $N^-$ layer 3 on one end, and to expose the side of the $N^+$ layer 5 on the other end in the horizontal direction relative to the plane of the $P^+$ substrate 31. The trenches 23 are provided in such a manner that the trenches 23 penetrate the $N^+$ layer 5 to expose the surface of the P layer 4 on an end in the vertical direction relative to the plane of the $P^+$ substrate 31. The trenches 23 are arranged between portions of the $P^+$ layer 6 in such a manner as to be spaced apart from the side of the $P^+$ layer 6.

Note that the trenches 23 may be provided so that each of the trenches penetrates the $N^+$ layer 5 and the P layer 4 to expose the surface of the $N^-$ layer 3 in the vertical direction relative to the plane of the $P^+$ substrate 31, and so that each of the trenches penetrates the P layer 4 and the $N^-$ layer 3 to expose the side of the N layer 2 on one end, or penetrates the P layer 4, the $N^-$ layer 3 and the N layer 2 to expose the side of the $N^+$ layer 32 on one end and to expose the side of the $N^+$ layer 5 on the other end in the horizontal direction relative to the plane of the $P^+$ substrate 31.

In each of the trenches 23, the trench gate 11 including the gate insulating film 7 and the gate electrode 8 is provided to cover the trench 23. Here, an emitter electrode (not shown) is provided on the $N^+$ layer 5 and the $P^+$ layer 6. The emitter electrode is connected to the $N^+$ layer 5 and the $P^+$ layer 6.

As described above, in the semiconductor device according to the embodiment, the trench 21a is provided in the P+ substrate 1. In the trench 21a, the N+ layer 32, the N layer 2, the N− layer 3, the P layer 4 and the N+ layer 5 are formed in a stacked manner to cover the trench 21a. In the N+ layer 5, the trench 22 is formed in such a manner that the trench 22a partially penetrates the N+ layer 5 to expose the surface of the P layer 4 in the vertical direction relative to the N+ substrate 1, and partially penetrates the N+ layer 5 to expose the side of the P layer 4 in the horizontal direction relative to the N+ substrate 1. In the trench 22, the P+ layer 6 is provided to cover the trench 22. The trenches 23 arranged between portions of the P+ layer 6 in such a manner as to be spaced apart from the side of the P+ layer 6 are provided so that each of the trenches penetrates the N+ layer 5 to expose the surface of the P layer 4 in the vertical direction relative to the N+ substrate 1, and so that each of the trenches penetrates the P layer 4 to expose the side of the N− layer 3 on one end and to expose the side of the N+ layer 5 on the other end in the horizontal direction relative to the N+ substrate 1. In each of the trenches 23, the trench gate 11 is provided to cover the trench 23. The P+ layer 6 quickly withdraws, to the emitter electrode side, the carriers generated by the breakdown of the IGBT 90.

Thus, breakdown tolerance of the IGBT 90 that is a three-dimensional trench gate IGBT can be improved. Moreover, an ASO of the IGBT 90 can be increased.

Figure 18:
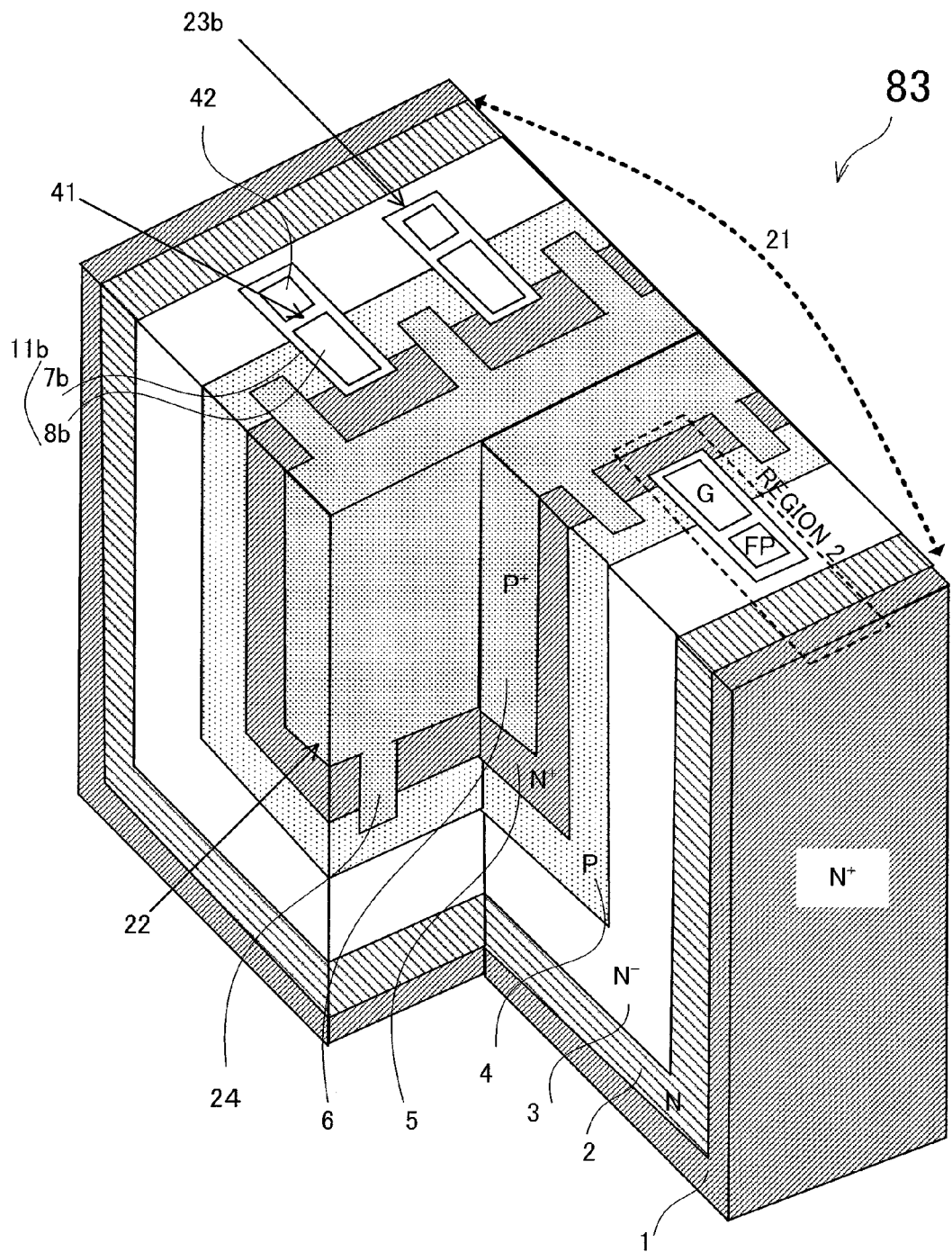
FIG. 18 is a cross-sectional perspective view showing a trench power MOS transistor according to a fifth embodiment.
Figure 19A:
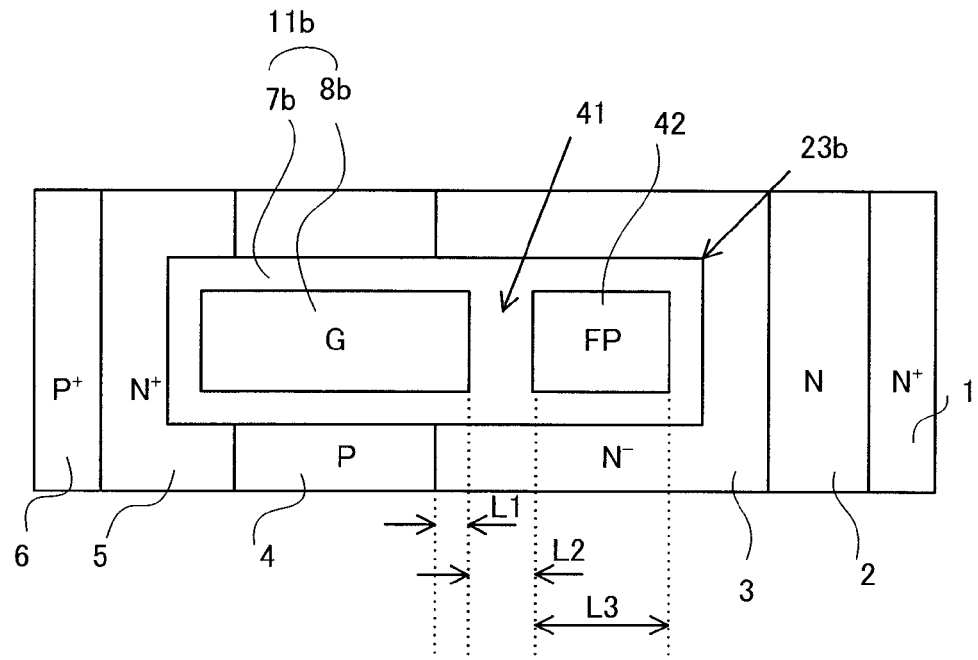
FIG. 19A is an enlarged plan view of region 2 in FIG. 18.
Figure 19B:
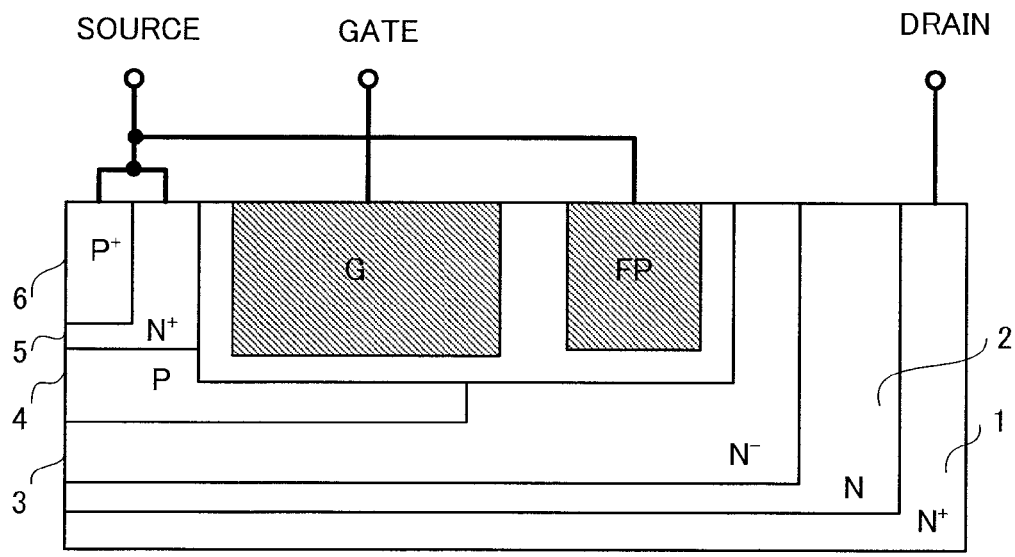
FIG. 19B is a view showing the connection of a field plate.
Figure 20:
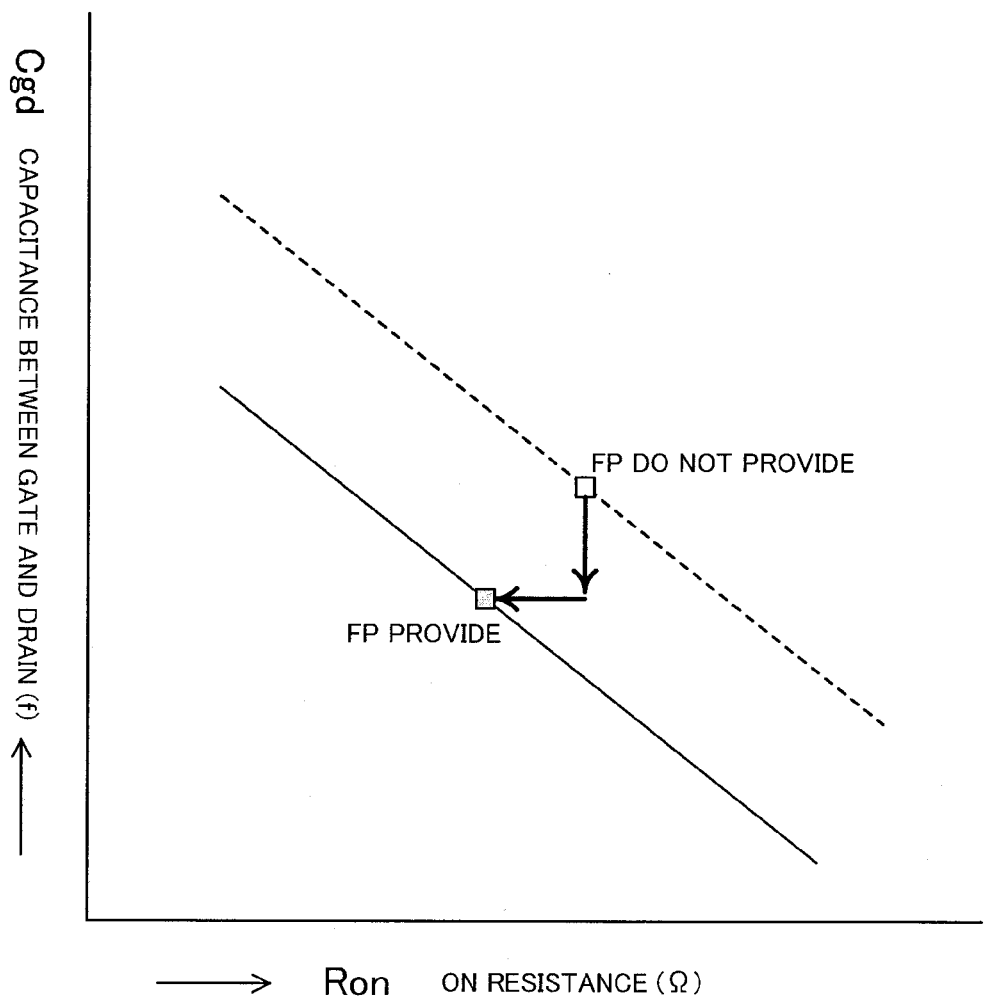
FIG. 20 is a graph showing a relationship between Cgd and Ron according to the fifth embodiment.

A semiconductor device according to a fifth embodiment is described with reference to the drawings. FIG. 18 is a cross-sectional perspective view showing a trench power MOS transistor. FIG. 19A is an enlarged plan view of region 2 in FIG. 18, and FIG. 19B is a view showing the connection of a field plate. FIG. 20 is a graph showing a relationship between Cgd and Ron. In the embodiment, a field plate is provided in a third trench in such a manner as to face a trench gate, and thus Cgd and Ron are reduced.

The same constituent portions as those of the first embodiment are denoted by the same reference numerals below. In the following, description of the same constituent portions is omitted, and only different portions are described.

As shown in FIG. 18, a trench power MOS transistor 83 is a 300-V three-dimensional N-channel trench gate power MOS transistor, for example.

In a P layer 4, rectangular trenches 23b (third trenches) are provided to penetrate the P layer 4 and to have one ends reach an N− layer 3 and the other ends reach an N+ layer 5. The multiple trenches 23b (the third trenches) are arranged in two parallel rows in a horizontal direction relative to an N+ substrate 1 that is a drain layer. A P+ layer 6 is placed between and on the side of the trenches 23b in such a manner as to be spaced apart from the trenches 23b by the N+ layer 5.

A trench gate 11b (denoted as G in FIG. 18) and a field plate 42 (denoted as FP in FIG. 18) are buried in the trench 23b. The trench gate 11b has a rectangular shape and is provided to cross the P layer 4 and to have one end reach the N− layer 3 and the other end reach the N+ layer 5. The trench gate 11b includes a gate insulating film 7b and a gate electrode 8b.

The field plate 42 is provided in the trench 23b (the third trench) in such a manner as to face the trench gate 11b with an insulating film 41 interposed therebetween. The field plate 42 is provided in the trench 23b on the N− layer 3 side with the gate insulating film 7b interposed therebetween. While the field plate 42 has a rectangular shape, the shape of the field plate is not necessarily limited to the rectangular shape. For example, the shape of the field plate 42 may be changed to a trapezoidal shape or the like. Moreover, more than one field plate 42 may be arranged in alignment in such a manner as to face the trench gate 11b. While an N+ polycrystalline silicon film is used for the field plate 42, a metal film, a metal silicide film, or the like may be used.

As shown in FIG. 19A, the gate electrode 8b has one end extended toward the N− layer 3 for a length L1 and the other end extended toward the N+ layer 5 for the length L1. The field plate 42 is placed to be spaced apart from the gate electrode 8b for a length L2. The field plate 42 has a length equivalent to a length L3 (in the horizontal direction in FIG. 19A).

As shown in FIG. 19B, the field plate 42 is connected to a source electrode. When the trench power MOS transistor 83 is operated, a higher voltage source voltage Vdd is applied to the drain, a gate voltage Vg is applied to the gate, and a lower voltage source voltage (ground potential) Vss is applied to the source and the field plate 42. The higher voltage source voltage Vdd, the gate voltage Vg and the lower voltage source voltage (ground potential) Vss are set as expressed by the following inequality.

$$Vdd > Vg \gg Vss \geq 0 \quad \text{Expression (1)}$$

The potential VFP of the field plate 42 is set to 0V, and the potential Vn3 of the N− layer 3 that is the drain layer is set to Vdd. Accordingly, the concentration in the surface portion of the N− layer 3, which is placed around the field plate 42 with the gate insulating film 7b interposed therebetween, is increased. Thus, as shown in FIG. 20, the trench power MOS transistor 83 having the field plate 42 provided therein can reduce a gate-drain capacitance Cgd and can also reduce an on-resistance Ron. Therefore, providing the field plate 42 can improve a trade-off relationship between the gate-drain capacitance Cgd and the on-resistance Ron.

As described above, in the semiconductor device according to the embodiment, the trench gate 11b and the field plate 42 are provided in the trench 23b. The trench gate 11b is provided to cross the P layer 4 and to have one end reach the N− layer 3 and the other end reach the N+ layer 5. The field plate 42 is provided in the trench 23b (the third trench) in such a manner as to face the trench gate 11b with the insulating film 41 interposed therebetween. When the trench power MOS transistor 83 is operated, the potential VFP of the field plate 42 is set to 0V, and the potential Vn3 of the N− layer 3 that is the drain layer is set to Vdd. The concentration in the surface portion of the N− layer 3, which is placed around the field plate 42 with the gate insulating film 7b interposed therebetween, is increased.

Thus, in addition to the effect of the first embodiment, the gate-drain capacitance Cgd and the on-resistance Ron can be reduced. Therefore, the trade-off relationship between the gate-drain capacitance Cgd and the on-resistance Ron in the trench power MOS transistor 83 can be improved.

Note that while the field plate 42 is connected to the source electrode in the embodiment, the invention is not necessarily limited to such a configuration. For example, a negative voltage may be applied to the field plate 42. Applying the negative voltage to the field plate 42 can suppress current collapse and the like.

Moreover, while the field plate 42 is placed in the vertical direction relative to the trench 21 and the trench gate 11b is placed to have one end extend to the N− layer 3 and the other end extend to the P+ layer 6, the invention is not necessarily limited to such a configuration. The invention may be applied to trench power MOS transistors of first and second modifications shown in FIGS. 21 to 23, for example.

Figure 21:
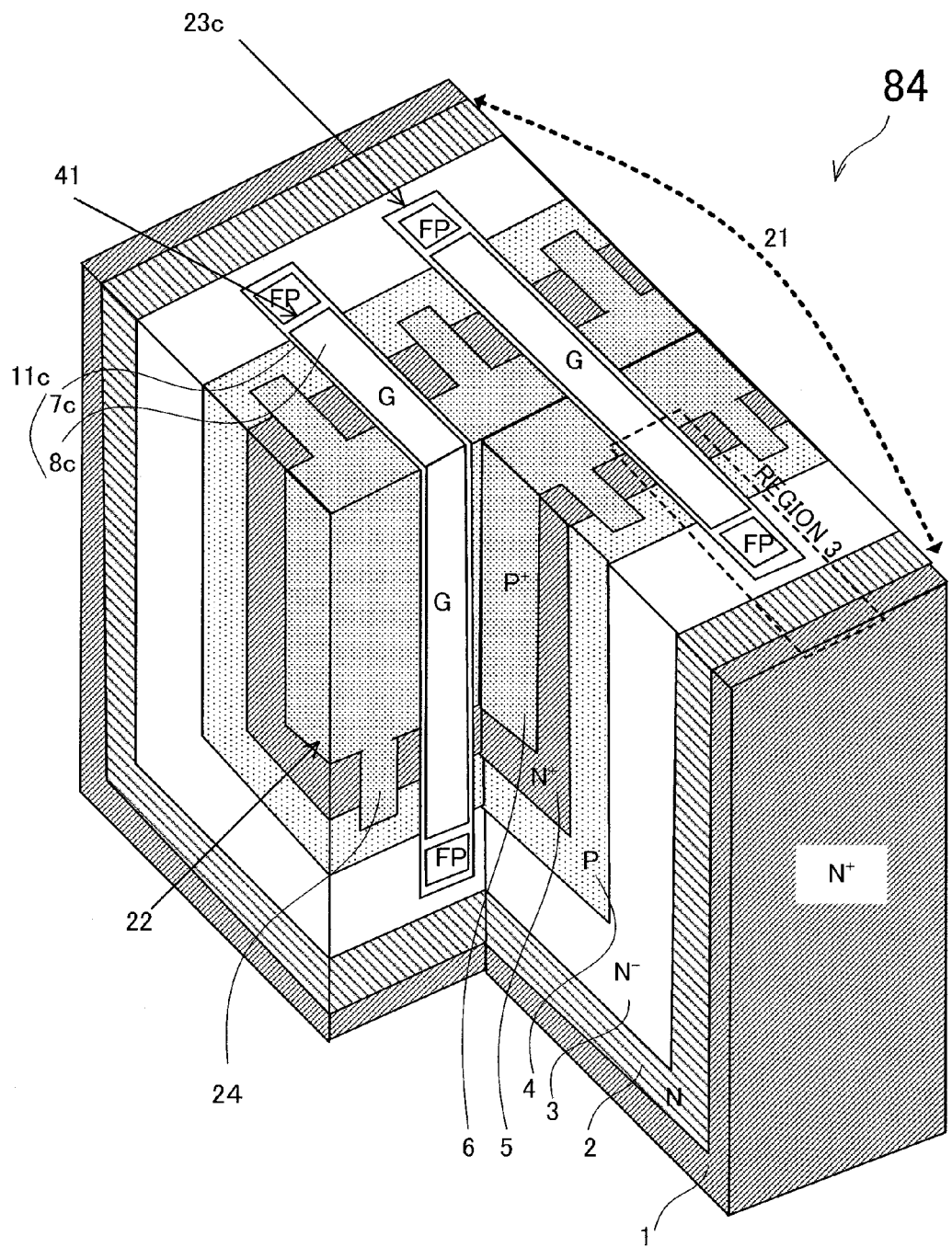
FIG. 21 is a cross-sectional perspective view showing a modification of the trench power MOS transistor according to the fifth embodiment.
Figure 22A:
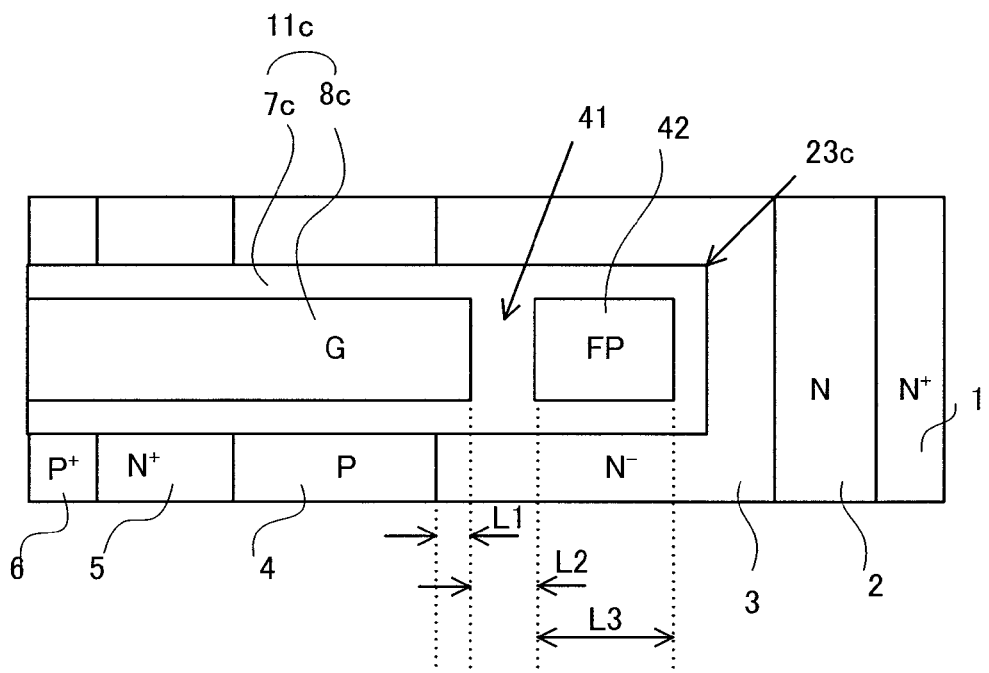
FIG. 22A is an enlarged plan view of region 3 in FIG. 21.
Figure 22B:
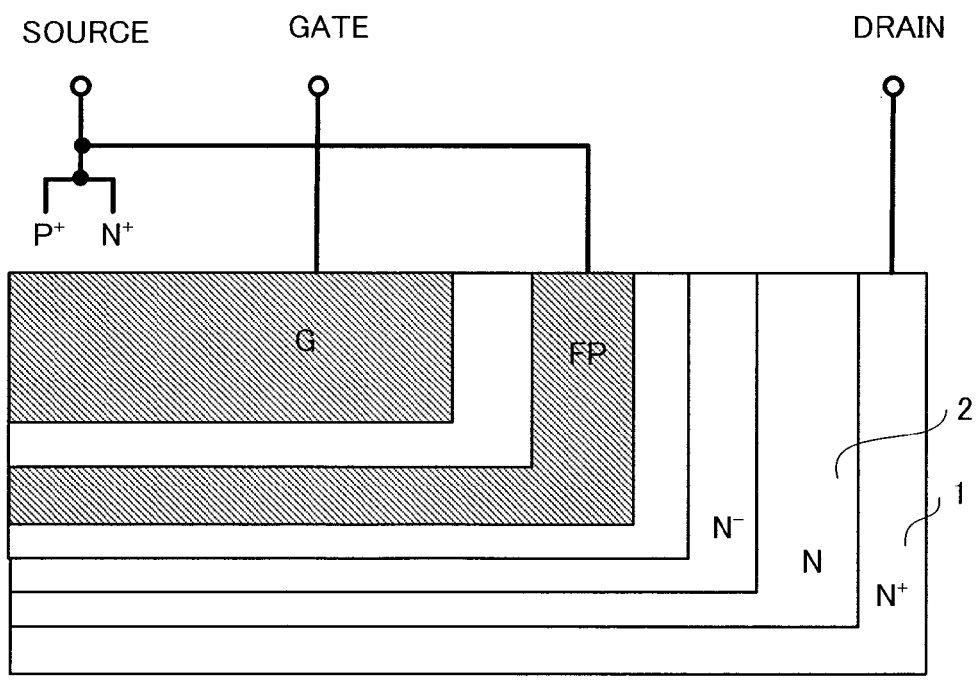
FIG. 22B is a cross-sectional view showing a structure of a field plate.

To be more specific, in a trench power MOS transistor 84 of the first modification shown in FIGS. 21, 22A and 22B, a trench 23c is extended to be longer than the trench 23b in the fifth embodiment, as shown in FIG. 21. A trench gate 11c including a gate insulating film 7c and a gate electrode 8c is placed to extend from one N⁻ layer 3 to the other N⁻ layer 3 as shown in FIG. 21. A field plate 42 is placed in a vertical direction relative to the trench 21 and in a horizontal direction relative to the bottom in such a manner as to face the trench gate 11c.

Figure 23A:
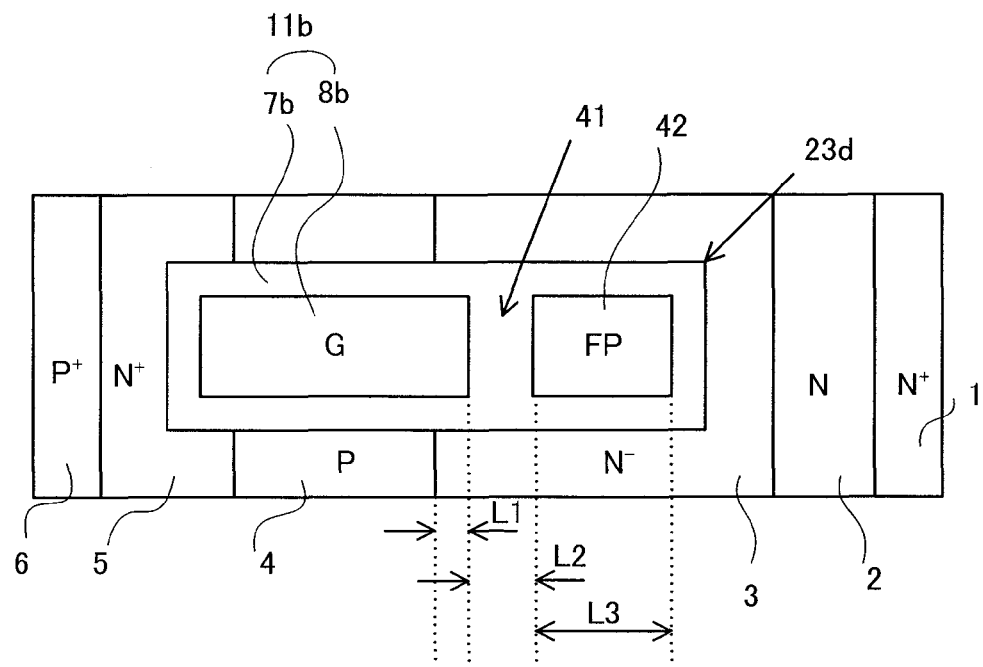
FIG. 23A is a plan view showing a modification of the trench power MOS transistor according to the fifth embodiment.
Figure 23B:
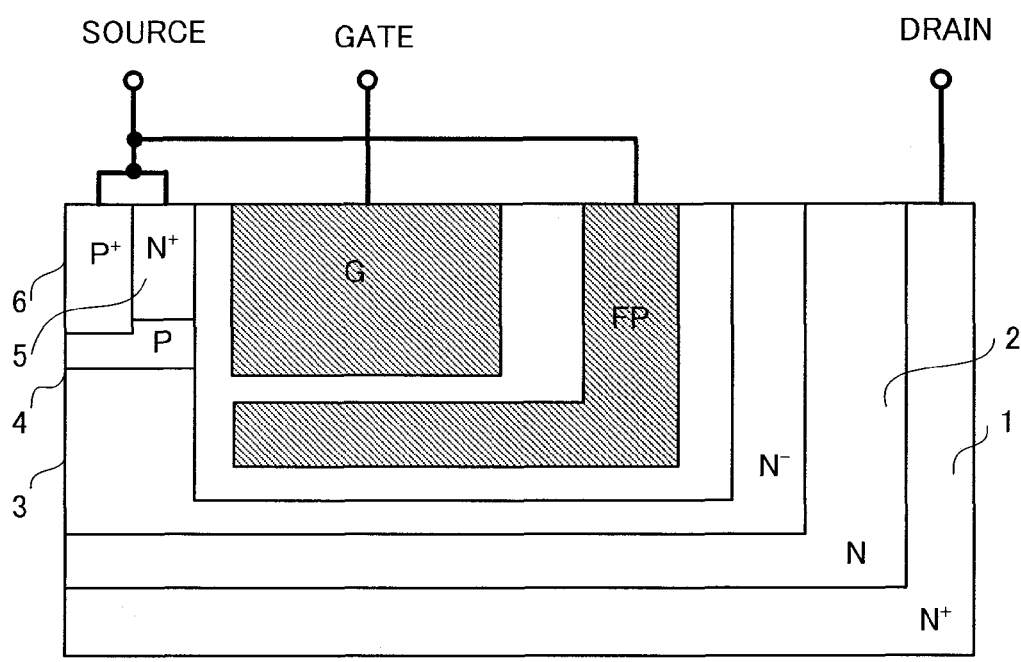
FIG. 23B is a cross-sectional view showing a structure of a field plate.

In a trench power MOS transistor of the second modification shown in FIGS. 23A and 23B, a trench 23d is formed to be deeper than the trench 23b in the fifth embodiment, as shown in FIG. 23B. A P⁺ layer 6 is formed to be deeper than that in the fifth embodiment as shown in FIG. 23B. A field plate 42 is placed to face a trench gate 11b in horizontal and vertical directions as shown in FIG. 23B.

Figure 24:
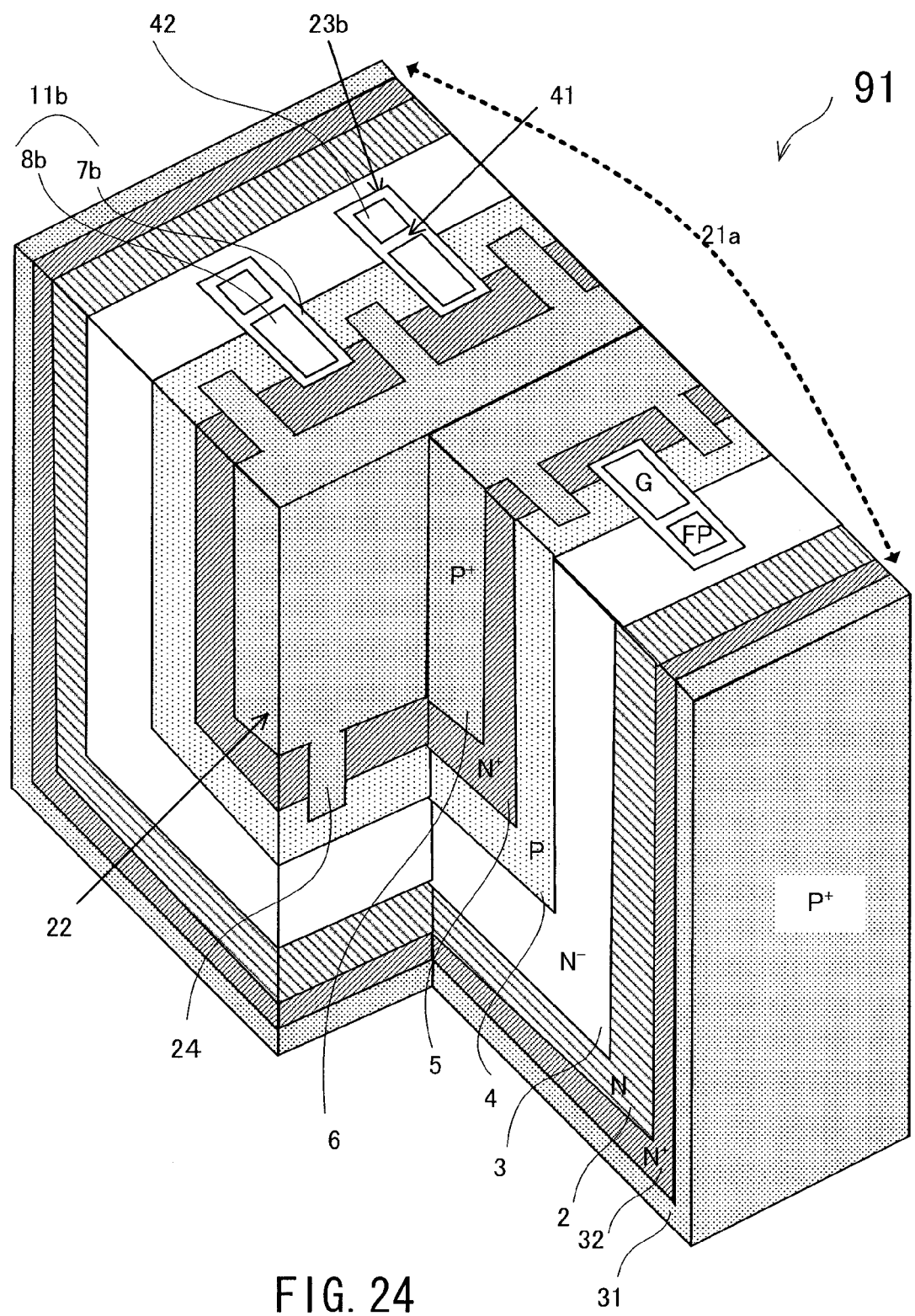
FIG. 24 is a cross-sectional perspective view showing an IGBT according to a sixth embodiment.

A semiconductor device according to a sixth embodiment is described with reference to the drawings. FIG. 24 is a cross-sectional perspective view showing an IGBT. In the embodiment, in a three-dimensional IGBT to be operated in a lateral direction, a field plate is provided in a third trench in such a manner as to face a trench gate. Thus, Cgd and Ron are reduced.

The same constituent portions as those of the fifth embodiment are denoted by the same reference numerals below. In the following, description of the same constituent portions is omitted, and only different portions are described.

As shown in FIG. 24, an IGBT (Insulated Gate Bipolar Transistor) 91 is a three-dimensional trench gate IGBT.

In a P layer 4, rectangular trenches 23b (third trenches) are provided to penetrate the P layer 4 and to have one ends reach an N⁻ layer 3 and the other ends reach an N⁺ layer 5. The multiple trenches 23b (the third trenches) are arranged in two parallel rows in a horizontal direction relative to an N⁺ layer 32 that is an N⁺ collector layer. A P⁺ layer 6 is placed between and on the side of the trenches 23b in such a manner as to be spaced apart from the trenches 23b by the N⁺ layer 5.

A trench gate 11b and a field plate 42 are buried in the trench 23b. The trench gate 11b has a rectangular shape and is provided to cross the P layer 4 and to have one end reach the N⁻ layer 3 and the other end reach the N⁺ layer 5. The trench gate 11b includes a gate insulating film 7b and a gate electrode 8b.

The field plate 42 is provided in the trench 23b (the third trench) in such a manner as to face the trench gate 11b with an insulating film 41 interposed therebetween. The field plate 42 is provided in the trench 23b on the N⁻ layer 3 side with the gate insulating film 7b interposed therebetween.

As described above, in the semiconductor device according to the embodiment, the trench gate 11b and the field plate 42 are provided in the trench 23b. The trench gate 11b is provided to cross the P layer 4 and to have one end reach the N⁻ layer 3 and the other end reach the N⁺ layer 5. The field plate 42 is provided in the trench 23b (the third trench) in such a manner as to face the trench gate 11b with the insulating film 41 interposed therebetween. When the IGBT 91 is operated, the potential VFP of the field plate 42 is set to 0V, and the potential Vn3 of the N⁻ layer 3 is connected to a Vdd side through a P⁺ substrate 31. The concentration in the surface portion of the N⁻ layer 3, which is placed around the field plate 42 with the gate insulating film 7b interposed therebetween, is increased.

Thus, the breakdown tolerance of the IGBT 91 that is the three-dimensional trench gate IGBT can be improved. Moreover, the ASO of the IGBT 91 can be improved. In addition, the gate-drain capacitance Cgd and the on-resistance Ron in the IGBT 91 can be reduced. Therefore, the trade-off relationship between the gate-drain capacitance Cgd and the on-resistance Ron in the IGBT 91 can be improved.

The invention is not limited to the embodiments described above, but various modifications may be made without departing from the spirit of the invention.

In the first to third embodiments, the source electrode is provided on the first trench 21 and the drain electrode is provided on the N⁺ substrate 1 side. Instead, the drain electrode may be provided on the first trench 21 and the source electrode may be provided on the N⁺ substrate 1 side. In such a case, the P⁺ layer 6 that is the P⁺ carrier withdrawal layer is preferably provided on the N⁺ substrate 1 side. Meanwhile, the N layer 2 and the N⁻ layer 3 are preferably provided on the drain electrode side.

Furthermore, while the P⁺ layer is buried in the second trench in the first to fourth embodiments, a buried metal layer, a buried metal silicide layer, or the like may be formed instead of the P⁺ layer.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first trench provided in a semiconductor substrate of a first conductivity type;
a first semiconductor layer of the first conductivity type having an impurity concentration lower than that of the semiconductor substrate, a second semiconductor layer of a second conductivity type, and a third semiconductor layer of the first conductivity type having an impurity concentration higher than that of the first semiconductor layer, the first to third semiconductor layers being formed in a stacked manner to cover the first trench;
a second trench provided in the third semiconductor layer in such a manner that the second trench at least partially penetrates the third semiconductor layer to expose the second semiconductor layer in a vertical direction relative to a plane of the semiconductor substrate, and at least partially penetrates the third semiconductor layer to expose the second semiconductor layer in a horizontal direction relative to the plane of the semiconductor substrate;
a fourth semiconductor layer of the second conductivity type having an impurity concentration higher than that of the second semiconductor layer, the fourth semiconductor layer being formed to cover the second trench;
third trenches arranged between portions of the fourth semiconductor layer in such a manner as to be spaced apart from the side of the fourth semiconductor layer, the third trenches being provided so that each of the trenches penetrates the third semiconductor layer to expose the second semiconductor layer or penetrates the third and second semiconductor layers to expose the first semiconductor layer in the vertical direction relative to the plane of the semiconductor substrate, and so that each of the trenches penetrates the second semiconductor layer to expose the first semiconductor layer on one end or penetrates the second and first semiconductor layers to expose the semiconductor substrate on one end and to expose the third semiconductor layer on the other end in the horizontal direction relative to the plane of the semiconductor substrate; and trench gates formed to cover the third trenches, each trench gate including a gate insulating film and a gate electrode film formed in a stacked manner.

2. The semiconductor device according to claim 1, wherein the third and fourth semiconductor layers are connected to a source electrode, the semiconductor substrate is connected to a drain electrode, and when the semiconductor device is turned on, a channel layer is formed on the side of the trench gate in the vertical direction of the semiconductor substrate, and carriers flow through the channel layer from a source toward a drain.

3. The semiconductor device according to claim 1, wherein carriers are generated in the first semiconductor layer near the interface of the first and second semiconductor layers when the semiconductor device breaks down, the carriers are withdrawn to a source electrode through the second and fourth semiconductor layers.

4. The semiconductor device according to claim 1, wherein the semiconductor substrate is a first drain layer of an N type having a high impurity concentration, the first semiconductor layer is a second drain layer of the N type having an impurity concentration lower than that of the first drain, and the third semiconductor layer is a source layer of the N type having a high impurity concentration.

5. The semiconductor device according to claim 1, wherein the semiconductor substrate is a first drain layer of an N type having a high impurity concentration, the first semiconductor layer includes a second drain layer and a drift layer, the second drain layer of the N type has an impurity concentration lower than that of the first drain layer, the drift layer of the N type having an impurity concentration lower than that of the second drain layer, and the third semiconductor layer is a source layer of the N type having a high impurity concentration.

6. The semiconductor device according to claim 1, wherein the fourth semiconductor layer is a carrier withdrawal layer to withdraw carriers generated by the breakdown of the semiconductor device.

7. The semiconductor device according to claim 1, wherein the semiconductor device is an N-channel power MOS transistor.

8. The semiconductor device according to claim 1, further comprising
a field plate provided in the third trench in such a manner as to face the trench gate with an insulating film interposed therebetween so as to cover the third trench at the first semiconductor layer side.

9. The semiconductor device according to claim 8, wherein the field plate is connected to a source electrode.

10. The semiconductor device according to claim 8, wherein the field plate is composed of an $N^+$ polycrystalline silicon film, a metal film, or a metal silicide film.

11. A semiconductor device, comprising:
a first trench provided in a semiconductor substrate of a first conductivity type;
a first semiconductor layer of a second conductivity type, a second semiconductor layer of the second conductivity type having an impurity concentration lower than that of the first semiconductor layer, a third semiconductor layer of the first conductivity type having an impurity concentration lower than that of the semiconductor substrate, and a fourth semiconductor layer of the second conductivity type having an impurity concentration higher than that of the second semiconductor layer, the first to fourth semiconductor layers being formed in a stacked manner to cover the first trench;
a second trench provided in the fourth semiconductor layer in such a manner that the second trench at least partially penetrates the fourth semiconductor layer to expose the third semiconductor layer in a vertical direction relative to a plane of the semiconductor substrate, and at least partially penetrates the fourth semiconductor layer to expose the third semiconductor layer in a horizontal direction relative to the plane of the semiconductor substrate;
a fifth semiconductor layer of the first conductivity type having an impurity concentration higher than that of the third semiconductor layer, the fifth semiconductor layer being formed to cover the second trench;
third trenches arranged between portions of the fifth semiconductor layer in such a manner as to be spaced apart from the side of the fifth semiconductor layer, the third trenches being provided so that each of the trenches penetrates the fourth semiconductor layer to expose the third semiconductor layer or penetrates the fourth and third semiconductor layers to expose the second semiconductor layer in the vertical direction relative to the plane of the semiconductor substrate, and so that each of the trenches penetrates the third semiconductor layer to expose the second semiconductor layer on one end or penetrates the third and second semiconductor layers to expose the first semiconductor layer on one end and to expose the fourth semiconductor layer on the other end in the horizontal direction relative to the plane of the semiconductor substrate; and
trench gates formed to cover the third trenches, each trench gate including a gate insulating film and a gate electrode film formed in a stacked manner.

12. The semiconductor device according to claim 11, wherein
the fourth and fifth semiconductor layers are connected to an emitter electrode,
the semiconductor substrate is connected to a collector electrode, and
when the semiconductor device is turned on, a channel layer is formed on the side of the trench gate in the vertical direction of the semiconductor substrate, and carriers flow through the channel layer from an emitter toward a collector.

13. The semiconductor device according to claim 11, wherein carriers are generated in the second semiconductor layer near the interface of the second and third semiconductor layers when the semiconductor device breaks down, the carriers are withdrawn to the emitter electrode through the third and fifth semiconductor layers.

14. The semiconductor device according to claim 11, wherein the semiconductor substrate is a first collector layer of a P type having a high impurity concentration, the first semiconductor layer is a second collector layer of an N type having a high impurity concentration, the second semiconductor layer includes a buffer layer and a first base layer, the buffer layer of the N type has an impurity concentration lower than that of the second collector layer, the first base layer of the N type has an impurity concentration lower than that of the first collector layer, the third semiconductor layer is a second base layer of the P type having an impurity concentration lower than that of the first collector layer, and the fourth semiconductor layer is an emitter layer of the N type having a high impurity concentration.

15. The semiconductor device according to claim 11, wherein the fifth semiconductor layer is a carrier withdrawal layer to withdraw carriers generated by the breakdown of the semiconductor device.

16. A method for manufacturing a semiconductor device, comprising the steps of:
- forming a first trench in a semiconductor substrate of a first conductivity type, the first trench having a quadrangular prism shape elongated in a horizontal direction relative to a plane of the semiconductor substrate;
- forming a first semiconductor layer of the first conductivity type having an impurity concentration lower than that of the semiconductor substrate, a second semiconductor layer of a second conductivity type, and a third semiconductor layer of the first conductivity type having an impurity concentration higher than that of the first semiconductor layer, the first to third semiconductor layers being formed in a stacked manner to cover the first trench;
- polishing the first to third semiconductor layers to be flattened so that the semiconductor substrate is exposed;
- forming a second trench in the third semiconductor layer in such a manner that the second trench at least partially penetrates the third semiconductor layer to expose the second semiconductor layer in a vertical direction relative to the plane of the semiconductor substrate, and at least partially penetrates the third semiconductor layer to expose the second semiconductor layer in the horizontal direction relative to the plane of the semiconductor substrate;
- forming a fourth semiconductor layer of the second conductivity type having an impurity concentration higher than that of the second semiconductor layer, the fourth semiconductor layer being formed to cover the second trench;
- polishing the fourth semiconductor layer to be flattened so that the semiconductor substrate is exposed;
- forming third trenches in such a manner that the third trenches are spaced apart from the fourth semiconductor layer, the third trenches being formed so that each of the trenches penetrates the third and second semiconductor layers formed in the stacked manner to expose the first semiconductor layer in the vertical direction relative to the plane of the semiconductor substrate, and so that each of the trenches penetrates the second semiconductor layer to expose the first semiconductor layer or the semiconductor substrate on one end and to expose the third semiconductor layer on the other end in the horizontal direction relative to the plane of the semiconductor substrate; and
- forming trench gates in such a manner that the trench gates cover the third trenches, each trench gate including a gate insulating film and a gate electrode film.

17. The method for manufacturing a semiconductor device, according to claim 16, wherein the first to fourth semiconductor layers are formed using an epitaxial method.

18. The method for manufacturing a semiconductor device, according to claim 16, wherein the polishing for flattening is performed using a CMP method.

19. The method for manufacturing a semiconductor device, according to claim 16, wherein the first to third trenches are formed using an RIE method.

20. The method according to claim 16, wherein the semiconductor device is an N-channel power MOS transistor.

* * * * *